(12) United States Patent
Ahmed et al.

(10) Patent No.: US 8,346,398 B2
(45) Date of Patent: Jan. 1, 2013

(54) DATA CENTER THERMAL PERFORMANCE OPTIMIZATION USING DISTRIBUTED COOLING SYSTEMS

(75) Inventors: Osman Ahmed, Hawthorn Woods, IL (US); William Thomas Pienta, Prospect Heights, IL (US)

(73) Assignee: Siemens Industry, Inc., Alpharetta, GA (US)

( * ) Notice: Subject to any disclaimer, the term of this patent is extended or adjusted under 35 U.S.C. 154(b) by 560 days.

(21) Appl. No.: 12/537,043

(22) Filed: Aug. 6, 2009

(65) Prior Publication Data

US 2010/0076607 A1 Mar. 25, 2010

Related U.S. Application Data

(60) Provisional application No. 61/087,245, filed on Aug. 8, 2008, provisional application No. 61/087,232, filed on Aug. 8, 2008, provisional application No. 61/087,240, filed on Aug. 8, 2008.

(51) Int. Cl.
*G01M 1/38* (2006.01)

(52) U.S. Cl. ............................ 700/278; 700/32; 700/300

(58) Field of Classification Search .......... 700/276–278, 700/32, 300
See application file for complete search history.

(56) References Cited

U.S. PATENT DOCUMENTS

| | | | |
|---|---|---|---|
| 6,574,104 B2 | 6/2003 | Patel et al. ..................... 361/695 |
| 6,747,872 B1 | 6/2004 | Patel et al. | |
| 6,775,997 B2 | 8/2004 | Bash et al. ..................... 62/180 |
| 6,813,897 B1 * | 11/2004 | Bash et al. ..................... 62/175 |
| 2004/0008651 A1 | 1/2004 | Ahmed ........................ 370/338 |
| 2004/0144849 A1 | 7/2004 | Ahmed ............................ 236/1 |
| 2005/0187664 A1 | 8/2005 | Bash et al. | |
| 2005/0192680 A1 | 9/2005 | Cascia et al. .................... 700/29 |
| 2006/0071773 A1 | 4/2006 | Ahmed et al. ................. 340/521 |
| 2007/0084937 A1 * | 4/2007 | Ahmed ........................ 236/44 C |
| 2008/0066474 A1 | 3/2008 | Porter et al. .................... 62/127 |
| 2008/0072611 A1 | 3/2008 | Ahmed et al. .................. 62/175 |
| 2008/0077260 A1 | 3/2008 | Porter et al. .................... 700/90 |
| 2008/0140259 A1 * | 6/2008 | Bash et al. ..................... 700/278 |
| 2009/0012633 A1 | 1/2009 | Liu et al. ........................ 700/90 |

(Continued)

FOREIGN PATENT DOCUMENTS

WO 2006028846 A 3/2006

OTHER PUBLICATIONS

PCT Search Report dated Jan. 1, 2010.

(Continued)

*Primary Examiner* — Mohammad Ali
*Assistant Examiner* — Nathan Laughlin

(57) ABSTRACT

The various embodiments described herein relate to systems and methods, circuits and devices for providing data center cooling while optimizing power usage effectiveness and/or compute power efficiency of the data center. The various embodiments can provide optimized thermal performance and can reduce power consumption of the data center by strategically locating sensor modules, preferably microsystems with MEMS technology, in the data center and using a processing circuit to acquire data from the sensors and to generate a control law for operating the air conditioning system efficiently. In particular the sensors are operable to measure and provide granular environmental data to further characterize the environmental conditions of the racks locally, and the data center as a whole. The processing circuit may also generate a profile of local racks and simulate a data center environment to develop and test control strategies for implementation in the actual data center.

21 Claims, 14 Drawing Sheets

U.S. PATENT DOCUMENTS

2009/0113323 A1    4/2009    Zhao et al. .................... 715/764
2009/0150133 A1*   6/2009    Archibald et al. ................ 703/9

OTHER PUBLICATIONS

Amon, C.H., "MEMS-based Thermal Management of High Heat Flux Devices for Integrated Cooling of Electronics", Thermal and Thermomechanical Phenomena in Electronic Systems, 2004, ITHERM 2004, The Ninth Intersociety Conference in Las Vegas, NV, USA, Jun. 1-4, 2004, Piscataway, NJ, USA, IEEE, vol. 2, Jun. 1, 2004, p. 704.

Transforming Your Enterprise Magazine, Winter 2008, pp. 1-2, available at www2.hp.com/enterprise.

Azevedo, Dan, Hass, Jon, Cooley, Jud, Monroe, Mark, Lembke, Pam, Power Usage Effectiveness (PUE) & Data Center Infrastructure Efficiency (DCiE) Progress, 2009, pp. 1-21, The Green Grid, www.thegreengrid.org.

* cited by examiner

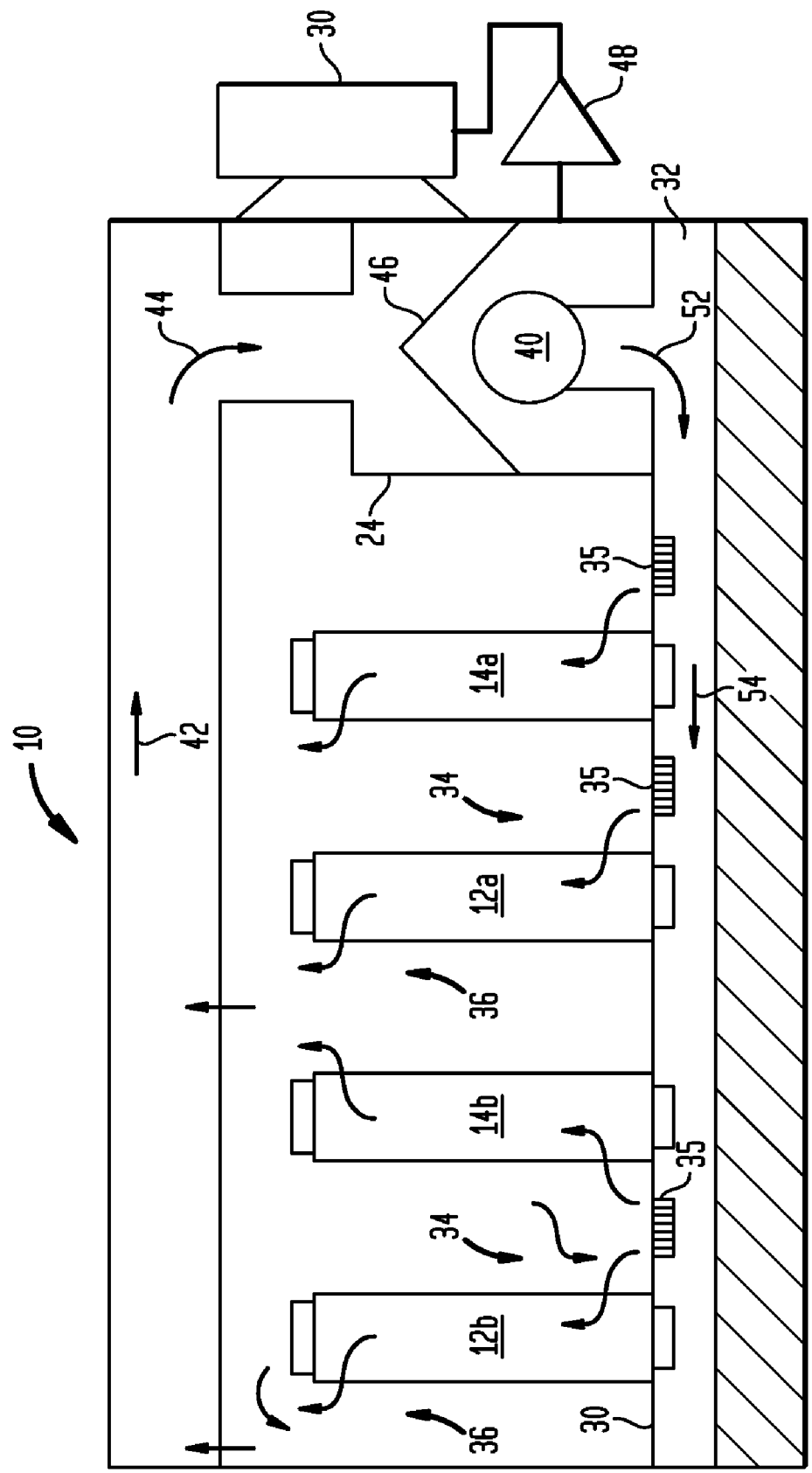

DATA CENTER THERMAL PERFORMANCE OPTIMIZATION USING DISTRIBUTED COOLING SYSTEMS

PRIORITY CLAIM

This patent document claims the priority benefit provided under 35 U.S.C. §119(e) to U.S. Provisional Patent Application Ser. Nos. 61/087,245, filed on Aug. 8, 2008, 61/087,232, filed on Aug. 8, 2008, 61/087,240, filed on Aug. 8, 2008. The content of these provisional patent applications are incorporated herein by reference in their entirety.

BACKGROUND

Data centers are parts of buildings or facilities in which a large number of computing and networking IT equipment, such as server computers, are mounted in racks that are arranged in the data center. The dense packing of the server computers results in the generation of a large amount of heat in a localized area. Too much heat may cause premature equipment failure. In addition, too much humidity can cause premature equipment corrosion, while too low can cause static electricity that damages the equipment. As a result, the data center must be cooled in a reliable manner in order to avoid the shutting down of, or damage to, the server computer hardware. Shutting down of server computers due to heat overload can cause significant economic loss.

To cool and control humidity of the racks of the data center, air conditioning systems, often specialized cooling units, have been developed for implementation directly in data centers. The specialized cooling units are sometimes known in the art as computer room air conditioning units ("CRACs") or computer room air handling units. One of the main challenges of cooling data centers is the air conditioning system is often operated at or near maximum cooling and/or power while some racks and/or servers are still running too hot.

Besides the challenges of cooling data centers, there can also be large power consumption associated with powering the data centers in addition to cooling data centers. Thus, power consumption and inefficiency with data centers are key concerns. This is especially true in the scenario of expending more power for cooling than for running IT equipment, and in the scenario of maximum cooling and power requirements limiting the amount of additional IT equipment that can be later added to the data center. As a result, the use of metrics for characterizing data center efficiency has been developed in the industry. For example, one such metric is power usage effectiveness (PUE) which is calculated by measuring the ratio of total facility power consumption (power equipment, cooling equipment, and other) to "useful" power consumption, i.e., IT equipment. A PUE of 2.0 indicates that for every watt of power used for IT equipment, one additional watt is consumed to cool and distribute power to the IT equipment. Another metric is compute power efficiency (CPE) which takes into account computational efficiency as well as total facility power consumption and IT power consumption. CPE is calculated by measuring the ratio of IT equipment computational efficiency to PUE.

While certain air conditioning system arrangements provide a solution to the need for enhanced cooling power within a data center, there is nevertheless a danger of individual server computers overheating, due to at least imbalanced loading of processing tasks within the data center, malfunction, mislocation or inefficiency of the air conditioning system. It is therefore desirable to reduce the risk of overheating or other malfunction of one or more server computers in a data center, while optimizing PUE and/or CPE of the data center.

SUMMARY

The various embodiments described herein relate to systems and methods, circuits and devices for providing data center cooling while optimizing PUE and/or CPE of the data center. The various embodiments can provide optimized thermal performance and can reduce power consumption of the data center by strategically locating sensor modules, preferably microsystems with MEMS technology, within the data center, and in particular coupled along the racks and server computers housed in the racks. The microsystems can be configured to measure and transmit granular environmental parameters (e.g., temperature, relative humidity, air flow) of their respective locations that a representative of the rack or sections thereof.

A first embodiment is an arrangement that includes a plurality of sensors and a processing circuit. The sensors are coupled to one or more racks and operable to measure at least one environmental parameter of the rack. Each sensor is further configured to wirelessly transmit a measured environmental parameter. The processing circuit is configured to receive information based on the measured environmental parameter. Additionally, the processing circuit is further configured to generate a profile indicative of the environmental parameter corresponding to the rack. The processing circuit is also further configured to generate a control law for operating the air conditioning system in order to satisfy a thermal demand of the data center in an optimally power efficient manner based at least in part on information representative of the rack profile.

In one aspect of the first embodiment, the processing circuit is further configured to generate the control law based on at least one of the generated rack profile and stored power efficiency characteristic information of air conditioning systems. In another aspect, the processing circuit is further configured to calculate total power consumption of air conditioning systems. In another aspect, the processing circuit includes a virtual data center representative of the data center and having a neural network. The virtual data center is configured to acquire the environmental parameter, generate a simulated control law for operating the air conditioning system based on the environmental parameter, and validate the simulated control law before implementation into the air conditioning system, A second embodiment is a method that includes the following steps: receiving at least one measured environmental parameter of one or more racks; generating a profile indicative of the measured environmental parameter of the rack; generating a control law operable to satisfy a thermal demand of the data center in an optimally power efficient manner based at least in part on information representative of the rack profile; and implementing the control law to operate the air conditioning system.

A third embodiment is another arrangement that includes a plurality of sensors and a rack controller. The sensors are coupled to one or more racks and operable to measure at least one environmental parameter of the rack. Each of the sensors is configured to wirelessly transmit a measured environmental parameter. The rack controller is coupled to the rack and associated with one or more sensors. The rack controller includes a processing circuit configured to receive information based on the measured environmental parameter from the respective sensors. The processing circuit is further configured to generate a control law configured to operate one or more air conditioning systems in order to satisfy a local thermal demand of the rack in an optimally power efficient manner based at least in part on information representative of the environmental parameter.

A fourth embodiment is another arrangement that includes a plurality of sensors and a processing circuit. The sensors are coupled to one or more racks and operable to measure at least one environmental parameter of the rack. Each of the sensors is configured to wirelessly transmit a measured environmental parameter. The processing circuit is configured to receive information based on the measured environmental parameter. The processing circuit is further configured to generate a control law configured to operate a dedicated cooler configured to at least partially satisfy a local thermal demand of the rack. Also, the processing circuit is further configured to generate a control law configured to operate one or more air conditioning systems in order to satisfy an overall thermal load of the data center, each in an optimally power efficient manner based at least in part on information representative of the environmental parameter.

Other embodiments are disclosed, and each of the embodiments can be used alone or together in combination. Additional features and advantages of the disclosed embodiments are described in, and will be apparent from, the following Detailed Description and the figures.

BRIEF DESCRIPTION OF THE FIGURES

FIGS. 2A-2C are elevation views of various embodiments of a data center and a HVAC system used for cooling at least a portion of the data center.

DETAILED DESCRIPTION

The term "processing circuit" is used throughout the specification and may include one or more processing circuits of one or more devices capable of implementing various processing techniques, such as multiprocessing, multitasking, parallel processing and the like, for example.

The term "memory" is used throughout the specification and may include one or more memories and may be computer-readable storage media or memories, such as a cache, buffer, RAM, removable media, hard drive or other computer readable storage media. Memory can be implemented singly as, or a combination of, volatile and non-volatile memory. Memory may be operably connected to communicate with one or more processing circuits.

The term "I/O devices" is used throughout the specification and may include at least one of a user interface, graphical user interface, keyboards, pointing devices, remote and/or local communication links, displays, and other devices that may allow externally generated information to be provided to the processing circuit, and that may allow internal information of the processing circuit to be communicated externally.

Figure 1:
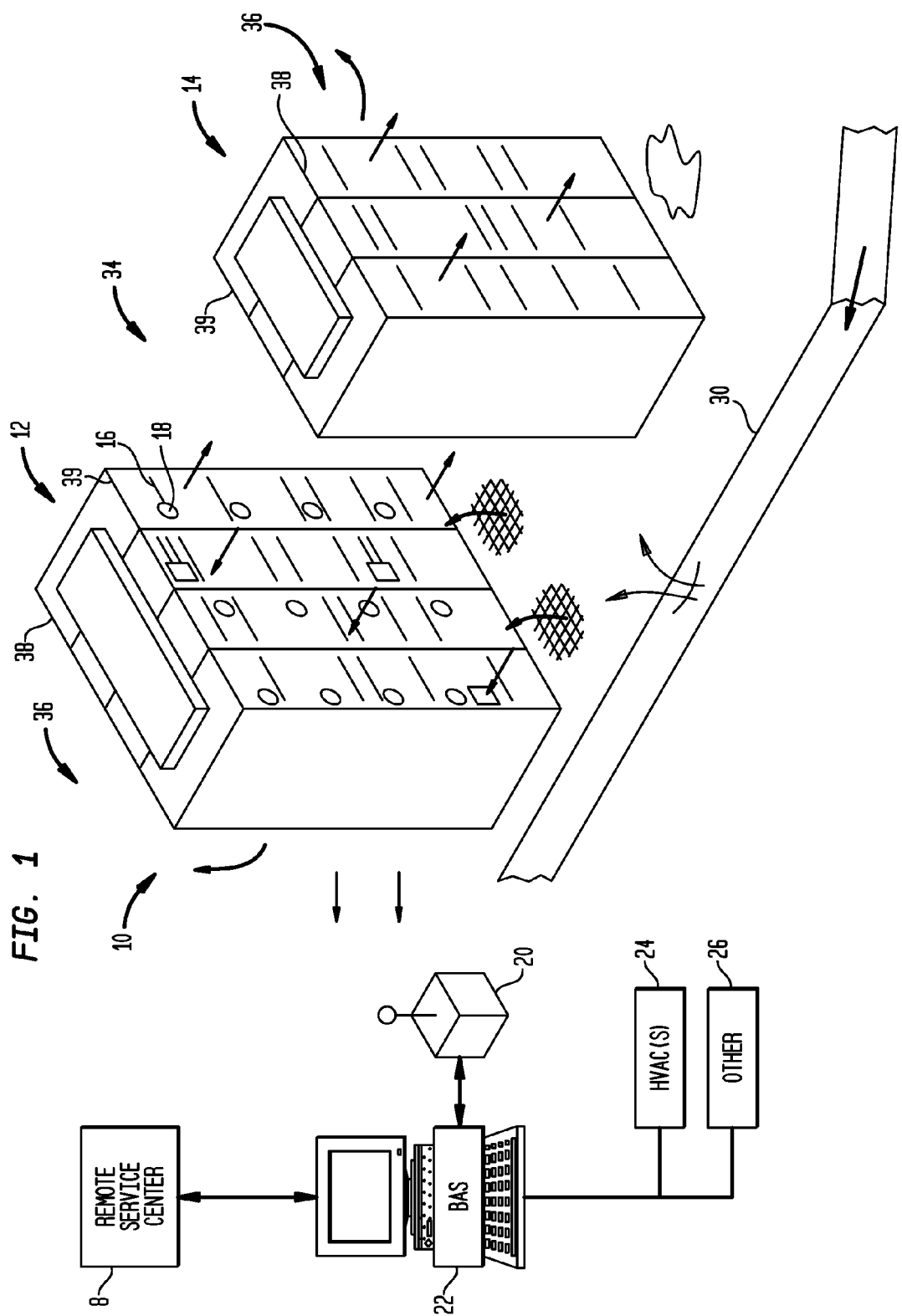
FIG. 1 illustrates a representative block diagram of one embodiment of a data center system.

Now referring to the figures where like reference numerals are used throughout to represent like components, FIG. 1 shows an illustrative system 8 for optimizing the power usage effectiveness (PUE) and/or the compute power efficiency (CPE) of a data center 10. Although "power" is used throughout the specification, power can also be characterized as energy.

PUE is calculated by measuring the ratio of total facility power consumption ($P_{FAC}$) including (power equipment ($P_{POW}$), cooling equipment ($P_{HVAC}$), lighting ($P_{LIT}$) and other) to "useful" power consumption, i.e., IT equipment ($P_{IT}$). Mathematically, PUE can be represented by the following equation:

$$PUE = P_{FAC}/P_{IT}, \text{ where } P_{FAC} \Sigma(P_{POW}, P_{HVAC}, P_{LIT} \ldots) \quad (1)$$

A PUE of 2.0 indicates that for every watt of power used for IT equipment, one additional watt is consumed to cool and distribute power to the IT equipment.

CPE takes into account computational efficiency (C %) as well as total facility power consumption and IT power consumption. In other words, CPE determines the percentage of total facility power actually used for computing. CPE can be applied to individual server computers or an entire data center. CPE is calculated by measuring the ratio of IT equipment computational efficiency to PUE. Mathematically, CPE may be represented by the following equation:

$$CPE = C\% * P_{IT}/P_{FAC} \text{ or } C\%/PUE \quad (2)$$

Many data centers have a server utilization (or computational efficiency) of 20% or less, which means for a data center with a PUE of 2.0, the CPE is 10% or 1 W for every 10 W of utility power is used for computing. Thus, it is desirable to optimize both PUE and CPE in order to reduce the power consumption of data center, and ultimately the operating costs of data centers.

FIG. 1 shows an illustrative data center 10 that includes a plurality of racks 12, 14 housing a plurality of IT equipment or components, mostly consisting of server computers 16. In accordance with this embodiment, at least one server computer 16 also includes a microsystem 18 operable to measure one or more environmental parameters of the data center and configured to communicate the data to another device. Preferably, the microsystem 18 is a sensor module that is further operable to communicate the parameters wirelessly to a network device 20, e.g., a wireless hub, router, network switch and the like. The network device 20 is operable to communicate the parameters of the microsystems 18 to the building automation system (BAS) 22. BAS 22 can be connected to a HVAC (heating, ventilation and air conditioning) system(s) 24 or other building power equipment 26, such as lighting and alarms and security. BAS 22 is further operably connected to communicate information with a remote building environmental management system ("remote service center") 28 which is configured to analyze, model, develop, and/or predict at least one of environmental parameters, profiles of parameters, and control laws for optimizing PUE and/or CPE of the data center 10. The devices of system 8 can communicate with other devices of the system 8, singly or in combination, via at least one of a wireless network and a wired network, including a local area network (LAN), a wide area network (WAN), or the like.

One advantage of the embodiments is the availability of granular or location specific measurement of environmental conditions of the respective racks 12, 14 and server computers 16 housed within the racks that are arranged in the data center. The measurements may be used by the system (or other nodes) for monitoring, verification, and/or control of the indoor conditions of the data center 10, but also for regulating the power efficiency on a facility-wide or system-wide basis. The system 8 may also use the information for predicting environmental conditions in order to operate the HVAC systems(s) 24 in a more efficient manner. It is possible that a rack of server computers 16 generally has a good environment, but that portions of the racks do not, e.g., the server computers located at the top of the rack may be hotter than the server computers at the bottom of the same rack. The granular aspect of this embodiment, by providing multiple measurement devices on each rack 12, 14 and/or server computers 16, obtains information for each portion of the rack. Further, the use of multiple microsystems 18 on each rack can overcome the problem of single-point measurement in the instance where the single sensor for a data center is placed in a spot that is not really representative of the data center environmental conditions. By using multiple microsystems 18 on each rack, the chance of an anomalous measurement greatly affecting assessment of building conditions, in particular data center environmental conditions, is substantially reduced. This granularity also allows for problems to be detected more quickly and pin-pointed more readily.

According to FIG. 1, the data center 10 may include a raised floor 30. A plurality of wires and communication lines (not shown) may be located in the space 32 defined underneath the raised floor, which may also function as a plenum to deliver cold air from the HVAC system(s) 24 to the racks 12, 14. Although only two racks 12, 14 are shown, it should be understood that the data center 10 can include any number of racks, e.g., 100 racks, as well as any number of HVAC system(s). The racks 12, 14 are preferably arranged in cold aisle-hot aisle arrangements. In this arrangement, cold air is directed into the cold aisle 34 between adjacent racks 12, 14 through perforations 35 or vents within the floor, while the hot aisles 36, which do not have direct cold air, are designed to receive air heated by the heat dissipating server computers 16 in the racks 12, 14 out of the back side 38 of the racks where the heated air flows upward toward the ceiling in a path (ducted or unducted) back to the HVAC system(s).

Although referred to generally as server computers 16, it is understood that this includes one or more of processors, micro-controllers, high speed video cards, memories, semi-conductor devices, and the like, and one or more subsystems (not shown), e.g., computers, servers, etc. The server computers 16 are operable to perform various applications, such as computing, switching, routing, displaying, and the like.

The server computers 16 in the racks 12, 14 dissipate relatively large amounts of heat during execution of applications and operation of their electronic functions. Each server computer 16, and the front 39 of the racks 12, 14, e.g., the side of the racks facing the cold aisle 34, may include openings at least at the ends thereof to allow for ventilation and cold air in the front and exhaust hot air out of the back. Some racks may further include ventilation fans to assure the proper cooling of the server computers housed in the rack. The number of fans can depend on the size of the racks and the amount of server computers that will be in the rack. The ventilation fans typically have variable frequency drives that modulate the speed of the fan in response to a change in thermal load of the server computer. Having been generally known to include upwards of forty (40) or more server computers 16, the racks 12, 14 may require substantially large amounts of cold air to maintain the server computers 16 generally within a predetermined operating temperature range. Generally, the server computers 16 have an air inlet temperature range of between 15°-32° C. (59°-89.6° F.). The term "rack" used herein can refer to the entire rack itself, sections of the rack, or server computer(s) of the racks.

The microsystems 18 are operable to measure and provide granular environmental data to further characterize the environmental conditions of the rack, e.g., racks 12, 14, and the data center 10 as a whole. For example, the microsystems 18 can measure and provide at least one of relative humidity, temperature, pressure such as static pressure and velocity pressure, and air flow parameters such as air velocity and air volume, as well as provide a location identifier and time stamp. Such information may be used for controlling the operation of the HVAC system(s) 24 and for characterizing the thermal loads of the racks in order to develop rack profiles. In preferred embodiments each microsystem 18 includes a micro-electro-mechanical systems (MEMS) sensor (not shown). The MEMS sensor can include one sensor for all of the functionality, or may include collectively a MEMS humidity sensor, a MEMS temperature sensor, and/or a MEMS flow sensor. General examples of microsystems 18 including MEMS sensors are discussed in U.S. Patent Application Publ. Nos. 2004/0008651A1 and 2004/0144849A1, both of which are incorporated herein by reference. The use of MEMS sensors greatly reduces the size and power consumption of the overall sensor module as compared to a sensor module that uses conventional sensor devices.

Microsystems 18 enable multiple environmental conditions to be measured at nearly the exact same location so that calculated parameters are more accurate representations of the environmental conditions. For example, absolute humidity may be preferred to relative humidity for some environmental risks of server computers 16. If the absolute humidity at a specific location needs to be determined, it can be calculated from the temperature and relative humidity values at the identical location with the very same microsystem. The absolute humidity may even be able to be calculated on the processing circuit of the microsystem itself, thus reducing errors that can accumulate from signal transmission and remote processing. This also avoids having separate temperature and relative humidity sensors located at different locations which are then not measuring exactly the same air. Also, having more than one sensor located at a ventilation opening may, because of the physical size, significantly impede the air flow into the rack and/or server computer air inlet.

The microsystem 18 may also incorporate processing circuits for processing the measured data and converting it to digital signal and communicating with a transmission circuit for transmitting the processed data to another device, and a power management module for providing power to the processing circuit and/or the transmission circuit. The transmission circuit can be a RF circuit operable to communicate using local wireless communication protocols such as Bluetooth, or other short-range wireless protocols. The transmission circuit can be further operable to receive data signals from another device, e.g., other microsystems 18 or BAS 22.

The microsystems 18 are coupled to the racks 12, 14 and arranged in various configurations. In some examples, the microsystems 18 are arranged in a pattern similar to a grid. In other examples, the microsystems 18 are arranged proximate the server computers capable of larger heat dissipations. The microsystems 18 can be coupled to the front, back, top or side of the racks. For example, front coupled microsystems can be coordinated with back coupled microsystems in order to determine the amount of heat pickup between the two locations. Preferably, the microsystems 18 are attached proximate the ventilation opening, or the ventilation fan if available, so that the microsystems can sense at least one of the flow, temperature, and relative humidity through the opening or the fan. In some embodiments, the microsystems 18 can also be placed around the data center 10, such as on the ceiling, walls, or the floor or other places. One aspect of the microsystem's capabilities of at least some of the embodiments is the placement of the microsystems along each rack. The volume of cold air and/or the temperature of cold air can be varied according to the various heat load sections of the racks. For example, for sections where the heat load increases, the volume and/or temperature of cold air may also be increased. In some examples, the velocity and/or the direction of cold air can be directed to the various heat load sections. Microsystems 18 can be located in the air flow through the perforated tiles 35 on the raised floor of the cold aisle. These sensors can verify air temperatures and air flows, which are important in a raised floor data center because the underfloor area can become crowded with cable trays and other equipment that can redirect and/or impede air flow.

The microsystems 18 may also be connected directly the server computers 16 in a manner to sense exhaust air temperature and air flow of a server computer 16 in order to determine server loading so that the processing load of the server computer 16 can be characterized. In other words, a processing circuit can characterize the processing load of a server computer based on the condition of the exhaust air leaving the server computer. As mentioned earlier, the microsystems at the exhaust can be coordinated with the microsystems at the intake in order to determine the amount of heat pickup between the two locations. The heat pickup between these spots can be correlated with the heat rejected by the server computer during execution of processes. The server computers have certain thermal characteristics and ratings. To this end, a correlation between the heat pick up and the processing load can be determined. This can be beneficial in determining the processing load of a server computer 16 without establishing a communication protocol with the server computer. IT managers, who are typically concerned about data security, prefer that the server computers 16 are not communicating with outside systems, where data security might be compromised.

Figure 1A:
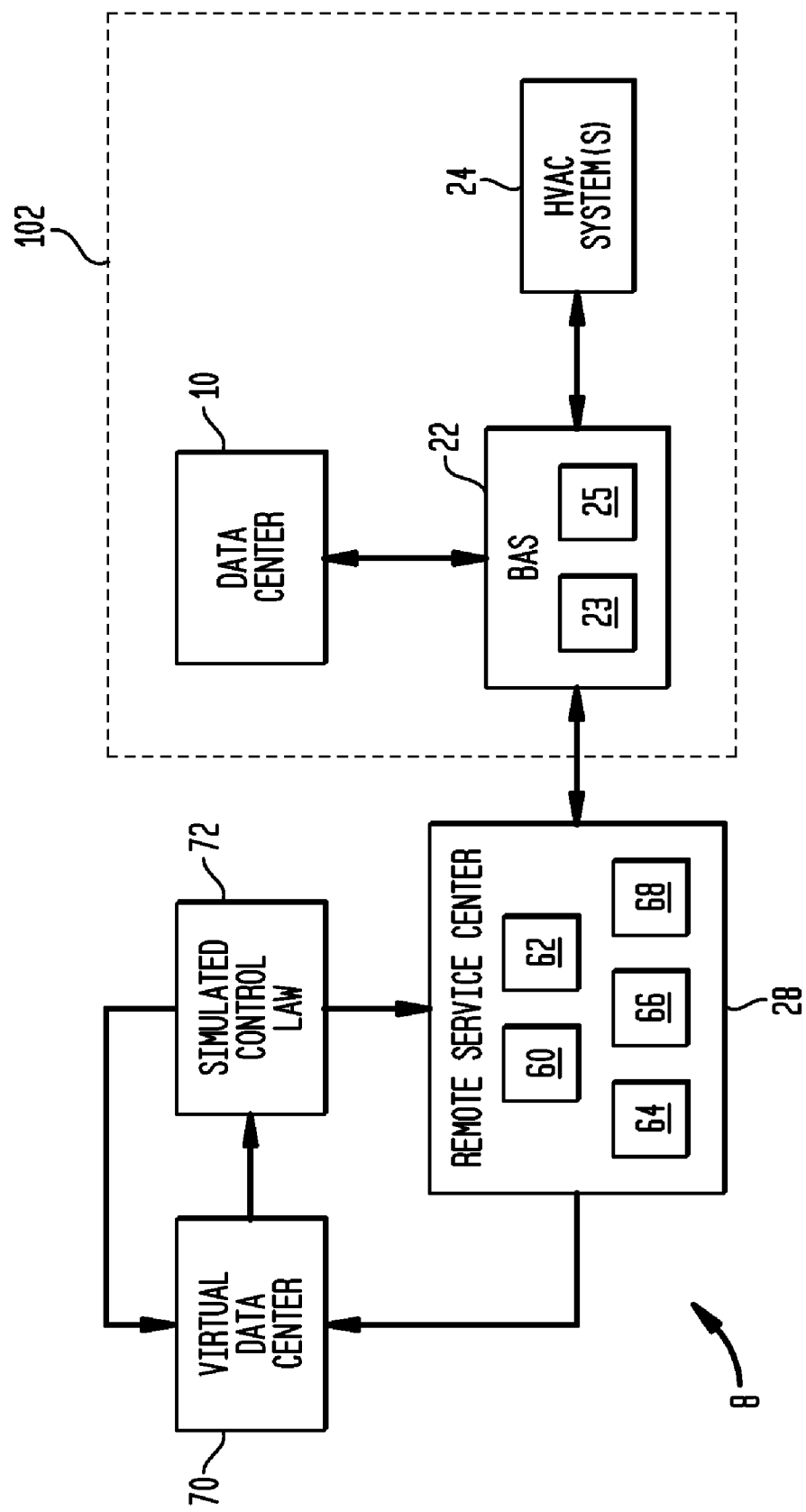
FIG. 1A illustrates a representative block diagram of another embodiment of a data center system.

With reference now to FIG. 1A, BAS 22 is operably connected to communicate with the microsystems 18, the HVAC system(s) 24 and other building systems 28 including lighting, security, fire safety system devices, and other machinery and equipment. Control laws, which include certain combinations of control set points or commands to cause a device to function, can be communicated between one or more components of the data center.

BAS 22 includes at least one processing circuit 23 and a memory 25. Such systems are known in the art and can comprise one or more devices having a general architecture of the APOGEE™ system available from Siemens Building Technologies Inc., of Buffalo Grove, Ill. BAS 22 may suitably take the form of a supervisory work station in a BAS such as the INSIGHT™ work station available from Siemens Building Technologies, Inc. In the alternative, BAS 22 may suitably be a configurable field controller, such as the PXC Modular field controller, also available from Siemens Building Technologies, Inc. In general, the processing circuit 23 is configured via other circuits to communicate BAS data (such as set points, sensor values, commands, control laws) with other BAS devices such as other controllers, or even with sensors and actuators. BAS 22 may further include special digital or analog I/O device(s) as may be necessary to communicate with control elements of the HVAC system(s).

BAS 22 typically operates the HVAC system(s) 24 in order to provide a control law, i.e., a set point for the flow of cold air, which may be predicated upon the detected or anticipated environmental conditions (temperature, relative humidity, flow) of the racks or portions thereof. For example, with regard to detected environmental conditions, actual cooling requirements for each of the racks may be actuated upon the thermal load of the racks. Alternatively, with regard to anticipated temperatures, anticipated cooling requirements for each of the racks may be predicated upon an impending thermal load on the racks, as further explained below.

FIG. 2A shows an illustrative underfloor data center 10 with the HVAC system 24 positioned at the end of a row of racks 12a, 12b, 14a, 14b. It is to be understood that the data center 10 can include an array of arrangements including rows of racks and HVAC system(s). One preferred embodiment of the HVAC system 24 includes one or more CRAC units. The CRAC unit shown is a DX split system and generally includes a fan 40 for drawing air over a cooling coil 46 so that cold air enters into the space 32. Air is supplied into the fan 40 from the heated air, represented as arrows 42, 44, in the data center system 10. In operation, the heated air enters into the HVAC system 24 as indicated by arrow 44 and is cooled by operation of the cooling coil 46 thermally coupled to a compressor 48, a condenser 50, and expansion valve, in any reasonably suitable manner generally known to those of ordinary skill in the art. It is to be understood that although the CRAC unit shown is a DX split system, it can also be a DX packaged unit or even a liquid coolant unit that is part of a liquid coolant system in a manner generally known to those of ordinary skill in the art. For example, for liquid coolant units the valves can be modulated to control the amount of liquid coolant being supplied to the unit. Moreover, although the illustrative unit is a CRAC unit, other HVAC system(s) may be employed with the data center, including: one or more air handling units using a liquid coolant system or DX system, dedicated liquid cooling units, VAV terminal units, modulating damper units and others. The HVAC system(s) may include one or more fans, compressors, condensers, evaporators, expansion valves, etc. The air handling units may also include an economizer operable to condition the space with outside air or "free cooling" that is within an acceptable temperature and relative humidity, as known in the art.

The cold air 52, 54 flows out of the raised floor 30 through a plurality of perforations 35 within the floor, commonly only disposed at the cold aisles. The perforations 35 in the floor are typically implemented by replacing solid floor tiles with perforated tiles, which are available in various hole sizes (smaller holes for smaller quantities of air up to larger holes for larger quantities of air). In addition, the raised floor can be supplied with adjustable louvers that can be repositioned manually to direct cold air to desired locations or repositioned by means of an actuator that can be controlled from BAS 22.

Based upon the volume and temperature of cold air, represented by arrows 52, 54, needed to satisfy the thermal loads of the racks 12a, 12b, 14a, 14b arranged in the cold and hot aisles 34, 36, the HVAC system(s) 24 may also be operated at various levels. For example, the capacity of the compressor 48 and the speed of the fan 40 may both be modulated in order to control the temperature and the volume of cold air delivered to the racks. In this respect, the compressor 48 can be a variable capacity compressor and the fan 40 can be a variable speed fan. The compressor 48 may thus be controlled to either increase or decrease the mass flow rate of a refrigerant therethrough. The invention is not limited to any specific type of compressor or fan, instead, any reasonably suitable type of compressor and fan that are capable of accomplishing certain aspects of the invention may be employed with the embodiments of the invention. The choice of compressor and fan may depend upon a plurality of factors, e.g., cooling requirements, costs, operating expenses, etc. The HVAC system(s) 24 should be sized and operable to satisfy the thermal loads of the data center 10 within an acceptable temperature and humidity range. One standard recommended for data center cooling is the ASHRAE standard, which recommends temperature limits in the range from about 18° C. (64.4° F.) to about 27° C. (80.6° F.) and relative humidity limited to less than 60% with lower and upper dew point temperatures in the range between about 5.5° C. (41.9° F.) and about 15° C. (59° F.).

Figure 2B:
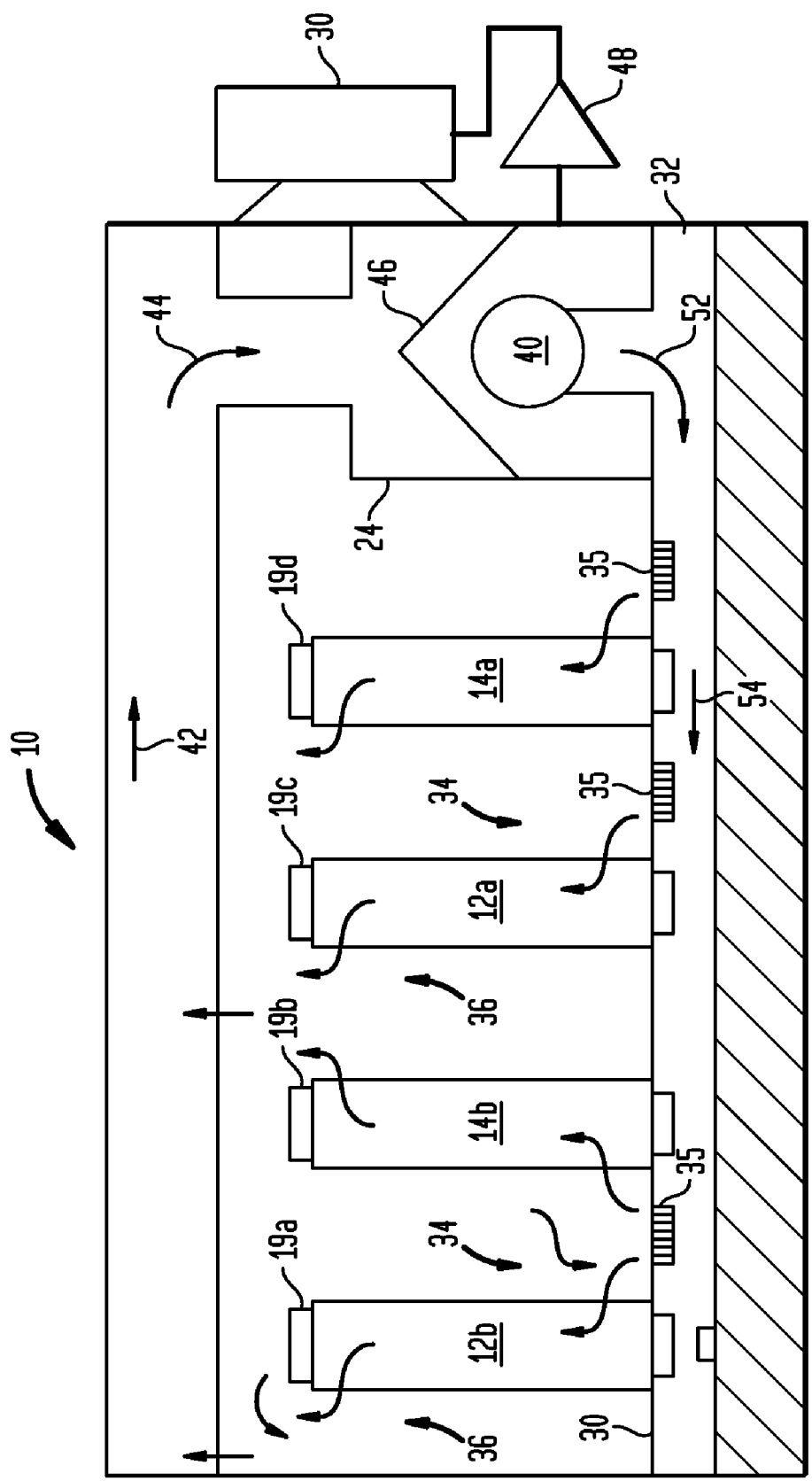
Figure 3A:
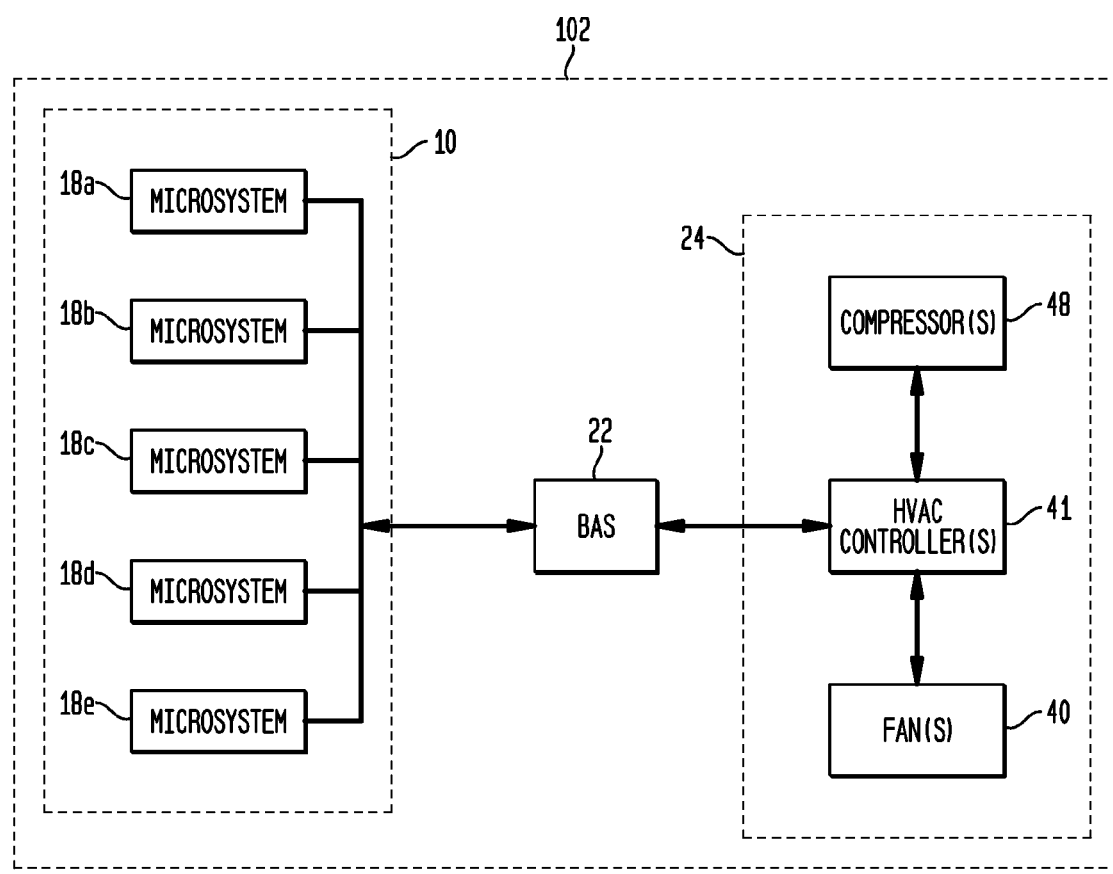
FIGS. 3A-3C illustrate representative block diagrams of various embodiments of a building system of FIG. 1A.
Figure 3B:
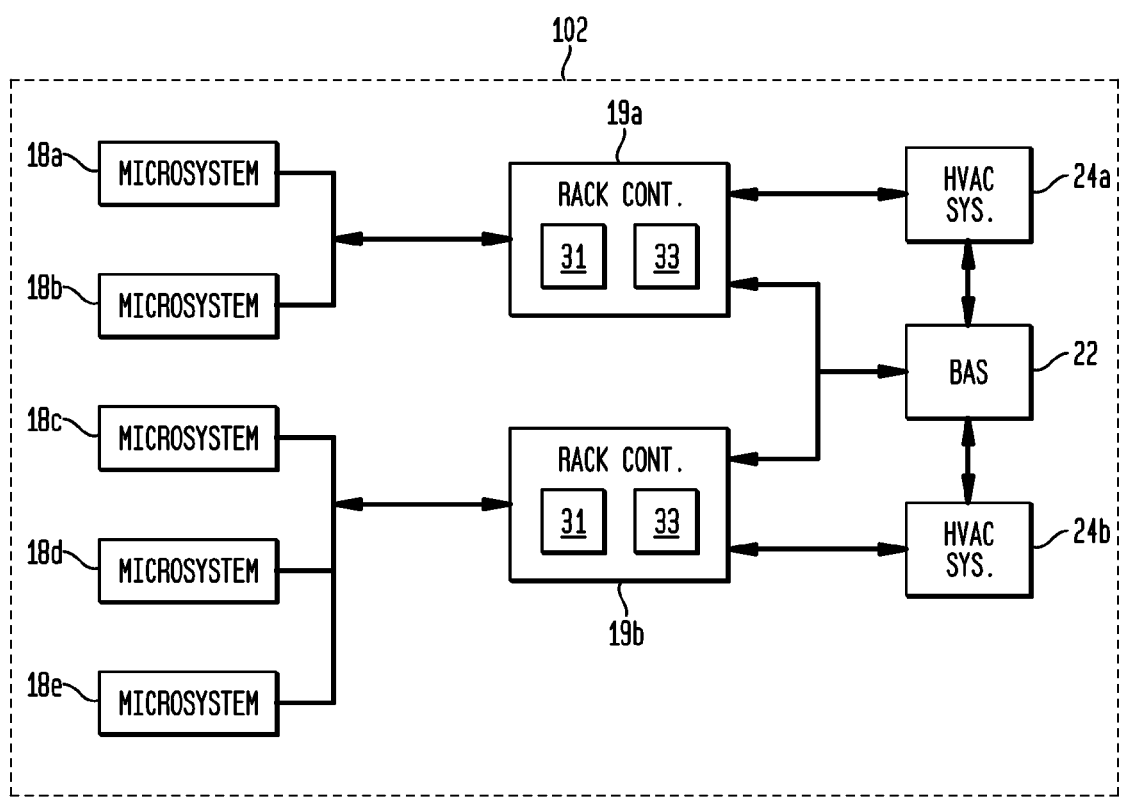
Figure 3C:
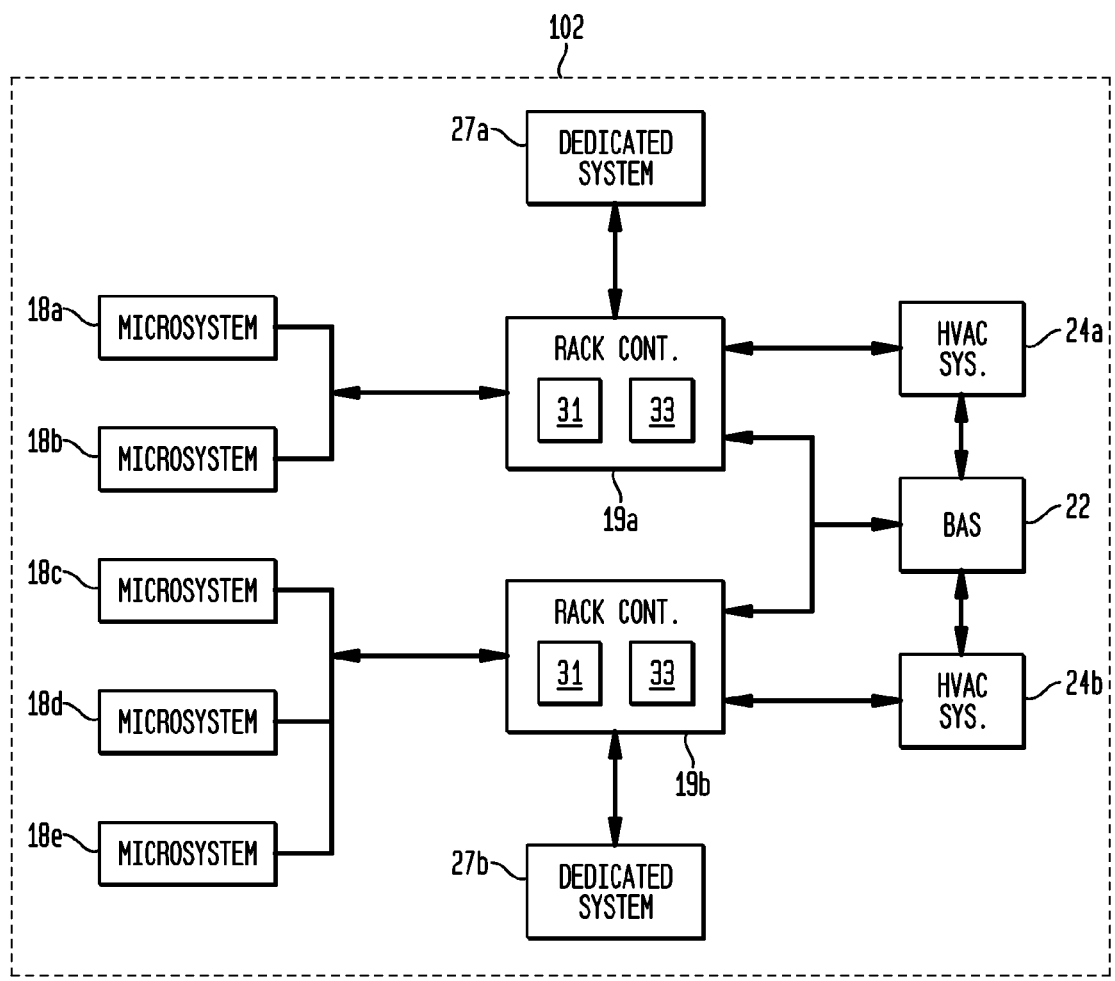

According to FIG. 2B, one or more of the racks 12a, 12b, 14a, 14b, of the data center 10 of FIG. 2A may further include one or more local controllers associated with one or more of the racks, generally referred to as rack controllers 19a-19d, or even a server controller associated with one or more server computers of a rack. Each of the rack controllers 19a-19d can be attached anywhere on the rack or server computer and is operable to communicate data from microsystems (not shown) that are associated with the respective rack controller. The rack controller is also configured to communicate this information of the microsystem as well as rack identifier information to BAS 22. In this regard, the rack controller includes a processing circuit 33 that may be interfaced with a rack memory 33 which is configured to provide storage of software, as shown in FIGS. 3B-3C. The rack memory 33 may also be configured to provide storage for containing data/information pertaining to server computers housed within the rack. The rack controller preferably includes a transmission circuit operable to transmit, preferably wirelessly, the processed data to another device and a power management module operable to provide power to the processing circuit and/or the transmission circuit, each similar to the components of the microsystems described above.

In one aspect, software can be executed by the processing circuit 31 of each of the rack controllers 19a-19d to provide the functionality described below to provide local control of one or more HVAC system(s), essentially override the existing control law of BAS 22, so that a local thermal load of a rack is satisfied locally. One manner to satisfy the local thermal loads is for the rack controller to control the closest HVAC system(s) in proximity to the rack controller, such as described in U.S. application Ser. No. 12/435,401 entitled, "Arrangement for Managing Data Center Operations to Increase Cooling Efficiency" to Pienta et al., filed May 4, 2009, which is incorporated herein by reference in its entirety. This can be beneficial when the overall thermal load of the data center is satisfied, and yet there are some hot spots at specific racks that still need satisfied. Each of the rack controllers 19a-19d can be further configured to characterize the environmental conditions into a single index number or a representative thermal load for each of the racks and/or server computers, which can then be communicated to BAS 22. In another example, each of the rack controllers 19a-19d, as well as the microsystems, can be further configured to have a thermal impact function consisting of a weighted polynomial. The weighted factors represent the proportion of heat generated by the racks or the server computers. This information can be communicated and used to better refine the control law of the overall system.

Figure 2C:
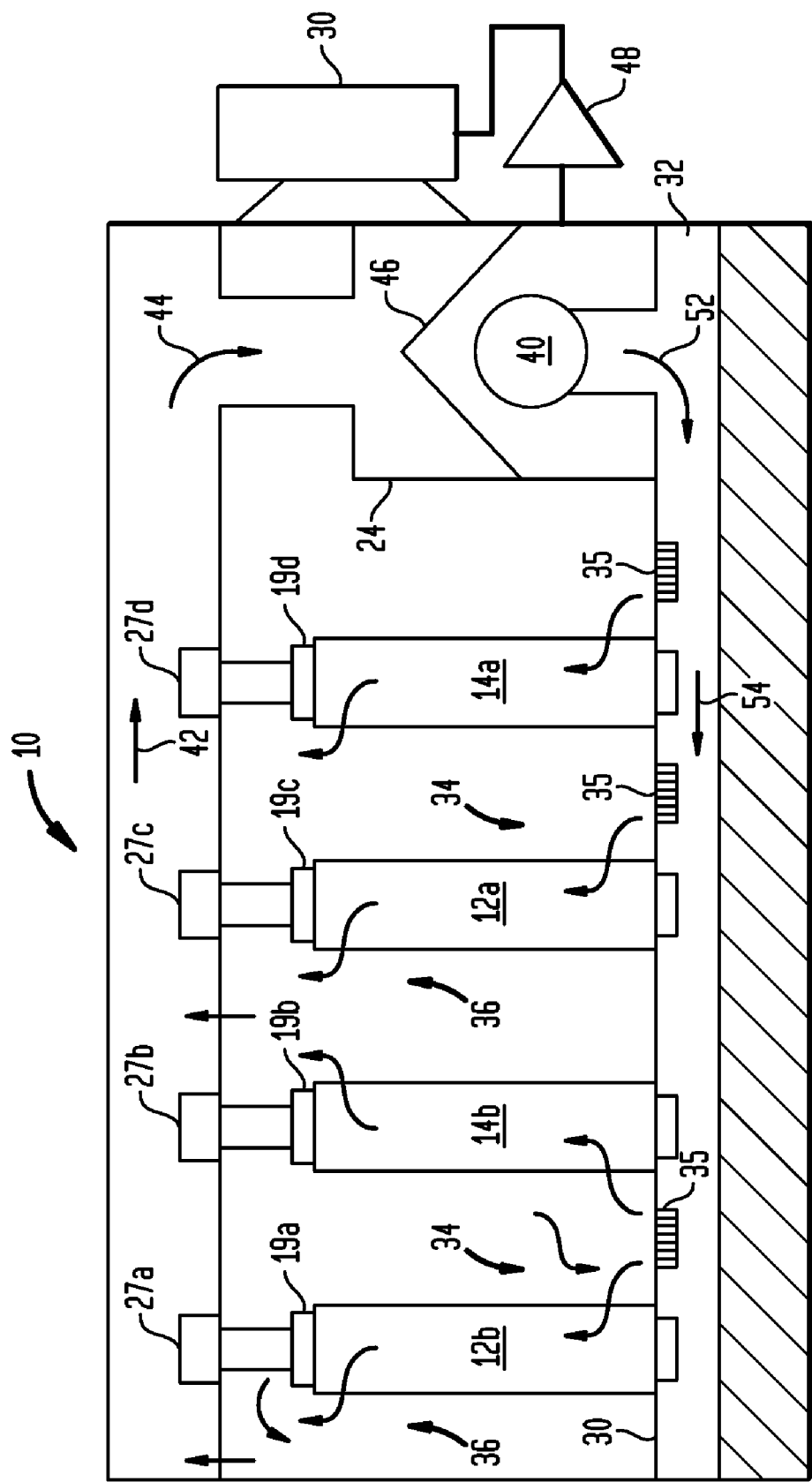

According to FIG. 2C, one or more of the racks 12a, 12b, 14a, 14b, of the data center 10 of FIG. 2B may further include one or more dedicated coolers 27a-27d. Each of the dedicated coolers 27a-27d can be configured to provide at least one of providing solely the cooling required to satisfy a local thermal load of a rack and providing supplemental cooling to supplement the HVAC system(s) 24 in order to satisfy a local thermal load of a rack. Cooling requirements of the dedicated coolers is dependent on the thermal load to be satisfied, and can range between about 1 KW to about 35 KW or more. The dedicated coolers may also include a dedicated cooler controller (not shown) that includes a processing circuit that may be interfaced with a memory which is configured to provide storage of software. The dedicated cooler controller preferably includes a transmission circuit operable to transmit data, preferably wirelessly, to another device and a power management module operable to provide power to the processing circuit and/or the transmission circuit. The rack controller is also configured to operably control the dedicated cooler through use of control laws, such as set points for discharge air temperature control, fan static pressure control, pump valve control, or the like. Data information of the dedicated coolers can be communicated to the rack controllers and to the BAS 22.

As shown, the dedicated coolers 27a-27d can be liquid cooling units mounted above the ceiling and thermally coupled to the racks through the use of pipes 29. The liquid cooling units are thermally coupled to the racks and/or each of the server computers 16. A coolant circulation path connects the server computers of a rack, in series or parallel, to the dedicated cooling unit and a liquid coolant is circulated through this path preferably by use of one or more pumps. The liquid coolant is drained from each of the server computers and is transferred to the outside of the server computers, preferably to a heat exchanger. The liquid coolant is cooled in the dedicated cooling unit and then recycled through each of the server computers. The server computers can have a circulated path with an inlet for receiving the liquid coolant and an outlet for rejecting the liquid coolant into the primary circulation path.

However, each of the dedicated coolers 27a-27d may also include ceiling, wall, or floor mounted forced air units or rack mounted forced air units that are coupled to a liquid coolant system or are a DX self-contained or split system, or the like. Furthermore, the dedicated coolers 27a-27d may also include fan only units that are configured to pull cold air directly into the rack. For example, the fan units can be positioned on the bottom of the racks into the plenum of the underfloor, where the fan units can pull air directly from the plenum. This prevents the cold air from mixing with the warmer room air before reaching the inside of the rack. This can minimize temperature differences between the top and bottom of the enclosure, while also preventing hot exhaust air recirculation to the inlet of the enclosure. The fan units can also be connected within the middle or top of the rack to improve air draw through the rack for similar functionality. It is to be understood by one of ordinary skill in the art that other forms of dedicated coolers such as devices, systems, or arrangement incorporating micro-cooling technology may be similarly employed and controlled for optimizing PUE and CPE of the data center.

According to FIG. 1A, the remote service center 28 is operably connected to BAS 22 to receive the actual data of the data center 10 from BAS 22 and process the data. The remote service center 28 is further operable to analyze, model, and/or develop environmental parameters of the data center in order to create a profile, as described below. To this end, the remote service center 28 is operable to communicate information to BAS 22 in order to change the control laws of one of the components of BAS 22 in response to a change in the rack profile. The remote service center 28 may also include I/O device(s), a processing circuit 60 and a memory 62.

The remote service center 28 further includes a modeling system 64 for developing and storing the profile indicative of the environmental conditions of the racks and/or data center 10. The remote service center 28 further includes an objective function 66 for modeling one or more environmental parameters and an optimization engine 68 for optimizing the modeled parameter(s). Each of the modeling system, objective function, and the optimization engine 64, 66, 68 is operably connected to communicate to the remote service center 28. The remote service center 28 can be further configured to predict and/or anticipate the environmental conditions related to the dissipation of heat load of the racks so that this information may be relayed to BAS 22 which may then manipulate the HVAC system(s) 24 according to the anticipated load to run at optimized levels.

The profile of the racks and/or data center and a library of templates can be stored within the memory 62. The profile is a collection of interrelated data objects representative of, or that correspond to, elements of the racks and/or data center. For example, the profile can provide a relatively comprehensive description of the environmental parameters, thermal loads and performance of each of the server computers and/or the racks of the data center, as well as BAS devices. Alternatively, the profile of the racks may also include a single index number represented of the thermal load, inlet and/or outlet temperature of the air, inlet and/or outlet relative humidity, inlet and/or outlet of air flow or the like.

In other embodiments, BAS 22 include references to relevant control laws of the device and information as to the area of the building in which the devices are located. As a result, the remote service center 28 can have stored control laws of the HVAC system 24 and components thereof in memory 62, or can develop optimal control laws through use of the modeling system, objective function, and the optimization engine 64, 66, 68. In the discussion below, the remote service center 28 can calculate, store, and generate a control law representative of optimized set points for a condenser water supply temperature, an output water supply temperature, a coil discharge air temperature, and air flow. However, other set points may be optimized in accordance with the principles of the present invention, such as, the discharge temperature from packaged cooling units, the variable speed fan discharge static pressure, the variable speed pump differential pressure for the most remote terminal unit in the building system, variable speed drives of compressors or the load at which the next chiller should be brought online to optimize power consumption and thusly PUE and/or the CPE of the data center.

In other examples, the memory 62 can have stored efficiency characteristic information for the HVAC system(s) 24 or components thereof associated with the data center. For example, the efficiency characteristic information may include part-load performance curves for each of the HVAC system(s) 24 or components thereof, including efficiency curves for various loads. The curves may be generated from the manufacturer and loaded into memory, or can be developed by identifying the power consumption for a plurality of cooling output values, as is known in the art. With this information, the modeling system, objective function, and the optimization engine can analyze the efficiency of the HVAC components individually, and/or each of the HVAC system(s) 24 as a whole, the total thermal load of the data center, and the environmental parameters locally at the racks to determine the optimal power consumption of the HVAC system(s) 24 and components thereof in order to optimize PUE and/or CPE of the data center.

Mathematical relationships between the various objects should not be limited to a single hierarchical relationship, but also allow for a number of alternative control laws to be employed. The optimization and validation of the control laws may be implemented by various means including artificial intelligence, physics based models, data mining, advanced visualization, or the like.

In one aspect, the remote service center 28 includes profiles for the racks and/or data center and control laws for HVAC system(s) 24 and components thereof that may be implemented using linear programming, unconstrained non-linear programming, or constrained non-linear programming methodologies. These are typically computer programs that implement a set of mathematical equations for modeling the HVAC system(s) 24 and components thereof. For example, the objective function 66 may be a computer program that implements a polynomial equation for the power consumption of the HVAC system(s) as a function of the change in thermal loading of each of the racks, although other data center and HVAC component parameters may be selected. In another example, the optimization engine 68 may be a computer program that computes a minimum using the first derivative of the objective function 66 with respect to the selected parameter as the criterion.

In another aspect, the modeling system 64 includes profiles for the racks and/or data center and control laws for components for the HVAC system(s) 24 that may be implemented using artificial intelligence models. These models may be implemented using an expert control system such as a fuzzy expert control system with crisp and fuzzy rules, genetic algorithms for optimization, or neural networks. For example, the modeling system includes a neural network for modeling the influence of one or more environmental conditions of the racks and/or data center relative to the HVAC system 24, the objective function for operating the HVAC system 24 as a function of power consumption based on the rack and/or data center profiles, and the optimization engine for implementing a genetic algorithm that generates a control law representative of optimized set points for satisfying the thermal load of the data center and for minimizing the power consumption of the HVAC system(s) 24 which in turn optimizes PUE and/or CPE of the data center. When relationships between input values and output variables are known, they may be included in a fuzzy expert control system as crisp rules. For example, the optimization engine can generate a control law representative of optimized set points for at least a condenser water supply temperature (for liquid coolant plants only), an output water supply temperature, and a coil discharge air temperature, although other global set points may be used as noted above.

With use of the modeling system, the future thermal performance of the racks and/or data center can also be predicted and in anticipation of the predicted thermal performance, the HVAC system(s) 24 may be controlled to provide cooling in an power efficient manner. Based on various relationship data developed by the modeling system between actual environmental conditions and the rack and/or data center profiles and actual performance data of the HVAC system(s) and components thereof, future thermal performance and profiles of the racks and/or data center can be predicted. To this end, the HVAC system(s) 24 may then be controlled to provide cooling in a power efficient manner in anticipation of the future thermal performance or profiles. For example, in some circumstances it is more power efficient to ramp up the performance of the HVAC system(s) in anticipation of the future thermal performance or profiles than to wait for the thermal profile actually materialize.

With reference to FIG. 1A, the remote service center 28 can also include an expert control system such as a fuzzy expert control system or a neural network operable to model a neural network model of the data center, or virtual data center 70. In general, the virtual data center 70 is used with the remote service center in tandem with a genetic algorithm in an optimization engine to determine a control law representative of the optimal set points for the HVAC system(s) 24 required to optimize PUE and/or CPE of the data center for a give thermal load of the rack and/or data center. The virtual data center includes other components 72 for simulating a control law and testing and validating the simulate control law for implementation. Here, actual environmental condition data from the data center 10 is communicated to the remote service center 28, where it is then communicated to the virtual data center 70. Mathematical relationships between the data inputs and outputs define crisp rules in the virtual data center 70.

For virtual data center implementation, one or more models of future rack and/or data center environmental parameters and/or profiles and HVAC system(s) 24 power consumption based on the current control law are designed. When the accuracy of the neural network models of the virtual data center is proven through a neural network training process, a prediction process selects the best neural network model for optimization of PUE and/or CPE of the data center. The training of the neural network is preferably performed offline and is typically based on historical trend data from the actual data center and external data such as utility rates, equipment ratings, weather forecasts, and the like. The virtual data center 70 is provided with data on its inputs and the data on its outputs are compared to target data by comparators. Any detected errors are used to further refine the neuron weights or other neural network design parameters. Once the virtual data center 70 is trained, it is then used to implement a system model for making predictions for data center optimization. These predictions are preferably provided online to an objective function, for example, the optimized PUE and/or CPE is the objective function for the system.

A genetic algorithm program in an optimization engine can then generate a random set of data represented of the control law and environmental parameters of the racks and/or data center and use the neural network model to predict the future profiles of the racks and/or data center and PUE and/or CPE with these points. If the future PUE and/or CPE with these points is less than PUE and/or CPE at the old control law, these potential solutions are passed onto the next generation, and another, more refined control law is generated. The process continues in this way until an optimal control law is found that optimizes PUE and/or CPE of the data center. Once the optimal control law is found, it is passed to BAS 22 for implementation within the data center 10. The design of a virtual data center 70 requires design choices such as selecting the number of inputs to the network, the number of layers in the network, the number of nodes in a layer, the learning rate for the network, and the momentum coefficient for the network. HVAC system(s) 24 and its component models discussed above provide a starting point for the selection of inputs for the virtual data center. Specifically, these input data can be: liquid coolant or hot water supply and return header temperatures, condenser water supply and return header temperatures, chiller plant or boiler plant load, liquid coolant or hot water flow, chiller or hot water boiler power, liquid coolant or hot water pump power (both primary and secondary pump KW), and air handler fan power. Additionally, rack thermal loads and profiles, building data and external data, such as outside air temperature, outside air dew point temperature; and plant equipment ratings improve the accuracy of the values generated by the virtual data center.

FIG. 1A illustrates one preferred embodiment of the system 8 for optimizing PUE and/or CPE of the data center 10. Here, BAS 22 is operably connected to communicate with the HVAC system(s) 24 and the data center 10 to define a building system 102. The building system 102 can be configured in various embodiments, as shown in FIGS. 3A-3C. Further, BAS 22 is operably connected to communicate with the remote service center 28, which is connected to the virtual data center 70.

FIG. 3A illustrates one embodiment of the building system 102 of FIG. 1A. Although FIG. 3A illustrates the data center 10 having five microsystems 18a-18e, it should be understood that the number of microsystems is not critical to the operation of the exemplary embodiment of the invention. Instead, the building system 102 may include any reasonably suitable number of microsystems to thus measure the environmental conditions of any reasonably suitable number of racks or portions thereof. The number of microsystems and the respective measurements (e.g., temperature, relative humidity, flow) of the number of racks may be upgradeable, e.g., scalable, to include any additional server computers and/or racks that may be included in the data center 10. Also, the microsystems can individually communicate to BAS 22 or can be combined with other microsystems to communicate therewith. BAS 22 is configured to acquire the parameters from all of the microsystems 18a-18e.

BAS 22 is shown operably connected to the HVAC system(s) 24 via a HVAC controller(s) 41 that includes a processing circuit and memory (not shown). The HVAC controller 41 is operably connected to the components of the HVAC system 24, e.g., one or more compressors 48 and one or more fans 40. Although one HVAC controller 41 is shown for simplicity, it is understood that more than one HVAC controller can be used, especially if there are more than one HVAC system 24. In some embodiments, BAS 22 is directly connected to the components instead of via the HVAC controller. Optionally, the HVAC controller 41 may be operably connected to local controllers of the components, as known in the art.

Regardless, BAS 22 generally operates through the use of control laws to manipulate the corresponding components of the HVAC system(s) 24 to compensate, i.e., changes the volume flow rate, velocity, and other similar characteristics of the cold air, for a change in thermal condition of the rack and/or data center. If there is an actual detected change or an anticipated change in the thermal condition of the respective racks and/or portions thereof, each of the racks generally receives substantially only the amount of cold air necessary to maintain the thermal condition of the portions of the racks within a predetermined thermal condition range. By controlling the cold air flow in this manner, the compressors 48 and fans 40 may be operated at substantially optimized levels, thereby decreasing the amount of power and thus optimizing PUE and/or CPE of the data center.

In accordance with another embodiment, FIG. 3B illustrates the building system 102 including the components of FIG. 3A, with the exception as described herein. Microsystems 18a, 18b are operably connected to the rack controller 19a, while microsystems 18c-18e are operably connected to the rack controller 19b. It is to be understood that more or less microsystems can be operably connected to more or less rack controllers. Preferably, the microsystems wirelessly transmit the environmental parameters to the respective rack controllers. The rack controllers 19a, 19b are operably connected to BAS 22. HVAC system 24a is located in close proximity to the rack controller 19a, while HVAC system 24b is located in close proximity to the rack controller 19b. The HVAC systems 24a, 24b can be operably connected directly to the respective rack controllers and BAS 22 in order to receive a control law therefrom, as shown. Optionally, the HVAC systems 24a, 24b may only be connected to BAS 22, which is then configured to receive overriding commands from the respective rack controllers in order to perform a desired function. As described herein, the rack controller is configured to determine whether local control of a respective HVAC system is required in order to satisfy a local thermal load of a respective rack.

In accordance with another embodiment, FIG. 3C illustrates the building system 102 including the components of FIG. 3B, with the exception as described herein. Dedicated cooler 27a is operably connected to the rack controller 19a, while the dedicated cooler 27b is operably connected to the rack controller 19b. It is to be understood that more or less dedicated coolers can be operably connected to more or less rack controllers. The dedicated coolers can be operably connected directly to the respective rack controllers in order to receive a control law therefrom, as shown. Optionally, the dedicated coolers may also be operably connected to BAS 22. As described herein, the dedicated cooler is configured to provide cooling for a predetermined server computer or rack in order to satisfy a local thermal load of the respective component.

Figure 4:
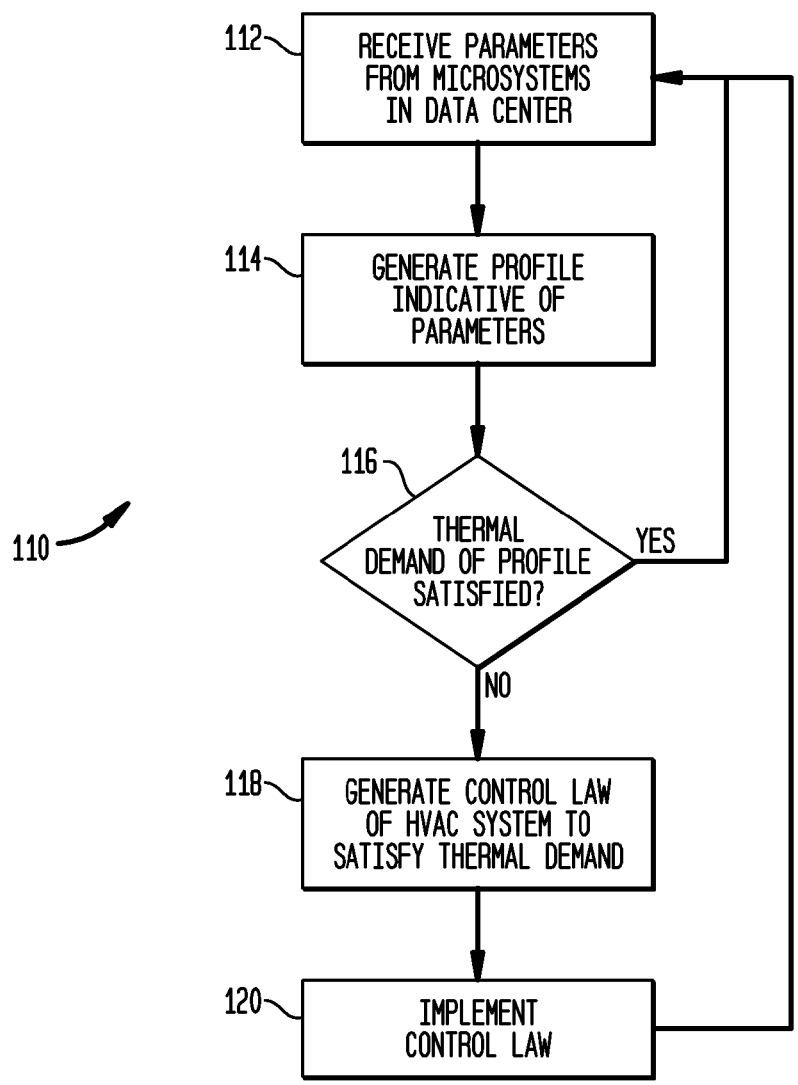
FIG. 4 illustrates a flow diagram of one embodiment of an exemplary set of operations that may be used by a processing circuit for satisfying a thermal load of a data center using measured environmental parameters.

FIG. 4 shows a flow diagram 110 of operations that may be carried out by BAS 22 and/or the remote service center 28 to gather and present data obtained by at least one of the various microsystems 18a-18e in a manner that is helpful for analyzing and optimizing PUE and/or CPE of the data center. Data of the HVAC system components may be obtained as well. Although the operations of FIG. 4 will be referenced as being performed by either BAS 22 or remote service center 28, it will be appreciated that other processing and/or computer equipment that receives or can be configured to receive the data from the microsystems 18a-18e may also perform such steps. In some embodiments, the remote service center 28 will perform some of the steps of FIG. 4, and BAS 22 will perform others. In other embodiments, some of the processing may even be carried out by the microsystems. Also, the following description of the flow diagram is one manner in which the system 8 may be operated, but it is understood that the description of the operation of the block diagrams of various embodiments is one of many ways in which the system may be operated.

In operation, the system 8 monitors and logs sensor data of the microsystems 18 and/or the components of the HVAC system(s) 24 in the following manner. The microsystems 18 sense one or more environmental conditions (e.g., temperature, humidity, flow), preferably automatically on an ongoing basis or when prompted by another device, such as BAS 22. One or more microsystems 18 from time to time transmits the sensed environmental parameters (sensor data) and identification information to another wireless device, e.g., the network device 20 shown in FIG. 1, or to BAS 22 directly. The network device 20 communicates the sensor data to BAS 22. The memory 25 of BAS 22 can then store the sensor data locally, and/or communicate the data to the remote service center 28.

Thus, in step 112, the processing circuit 23 of BAS 22 obtains the environmental parameters of each of the racks, e.g., racks 12, 14 and/or data center 10. The environmental parameters may suitably be the values for each individual microsystem 18 on a server computer 16, a rack, or a composite or derivative value for the rack and/or data center based on the values of all of the microsystems 18 in the data center 10. BAS 22 communicates the environmental parameters to the remote service center 28. The memory 62 of the remote service center 28 preferably stores the environmental parameters for the data center 10. The ongoing storage of the environmental parameters allows the parameter's values to be available for other applications, as well as the application described below. To this end, historical data and trends can be developed.

In step 114, the processing circuit 60 of the remote service center 28 creates a profile indicative of one or more environmental conditions of the racks and/or the data center from the environmental parameters. The profile may be further characterized as a thermal load for a particular rack or server computer. Analysis of each profile of the rack can determine the overall thermal load for the data center, as well as areas of the data center, including local loads of individual racks, that may have hot spots or cool spots.

With additional reference to FIG. 1A, the remote service center 28 can develop a profile of one or more environmental parameters of the racks, e.g., racks 12, 14, and/or the data center 10, as described above. Also, the remote service center 28 may suitably store the profiles in its memory 62. The stored data is time-stamped or at least associated with a time-date value. If the remote service center 28 has profiles of the racks and/or data center already stored in memory 62, the processing circuit 60 of the remote service center 28 can then compare the created profile with stored profiles and analyze trends and identify troubled areas.

In step 116, the processing circuit 60 determines if the thermal load of the data center 10 and/or the racks with the generated profile is satisfied with the current operating conditions based on a control law of the overall HVAC system(s) 24. If yes, the process returns to step 112 and continues to monitor and receive the environmental parameters from the microsystems.

If no, according to step 118, the processing circuit 60 generates an alternative control law for satisfying the overall thermal demands of the racks and/or data center. In step 120, the generated control law is to be implemented within the data center 10, and the operation can return to step 112.

Figure 5A:
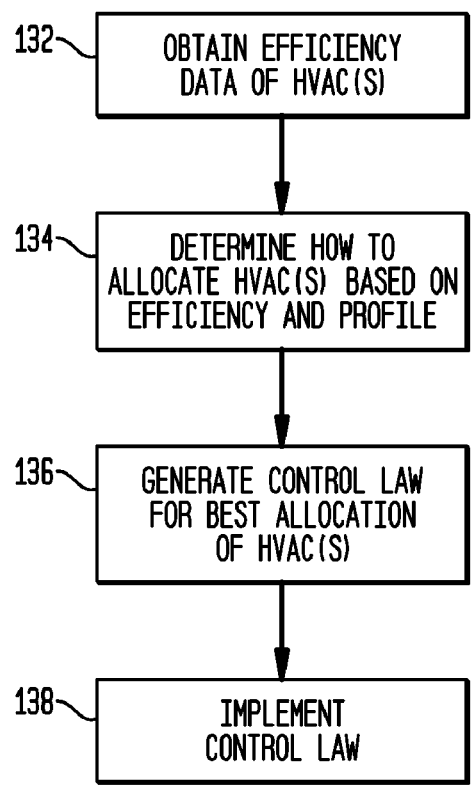
FIGS. 5A-5D illustrate flow diagrams of various embodiments of an exemplary set of operations that may be used by a processing circuit for satisfying a thermal load of a data center using measured environmental parameters.

FIG. 5A shows an example of generating a control law that may be used as step 118 in FIG. 4. In step 132, the processing circuit 60 obtains efficiency data for the HVAC System(s) 24 or components thereof. As described above, the efficiency data may comprise part load curves of output as a function of power consumption. The efficiency data can be entered into the memory 62 by user input or communications.

In step 134, the processing circuit 60 determines how to allocate the operation of the HVAC system(s) 24 and components thereof based on at least one of the efficiency data and the determined profiles of the racks, e.g., racks 12, 14, and/or data center 10. As described above, the processing circuit can calculate mathematical relationships or correlations between the profiles of the racks and/or data center and the power consumption of the HVAC system(s). The processing circuit then uses the relationships to develop a first control law for operating the HVAC system(s) and components thereof at the best efficiency in order to satisfy the thermal demands of the data center.

In step 136, the processing circuit 60 may determine whether the first control law is the best for satisfying the thermal load of the racks at the most optimal power efficiency. For a given overall thermal load based on the profile of the racks and/or data center, the power consumption of the HVAC system(s) is estimated using the efficiency data so that an overall efficiency is calculated for the first control law. Thereafter, the processing circuit 60 generates a second control law that is different than the first control law. The processing circuit 60 uses the same procedures to determine the overall efficiency for the second control law. The processing circuit 60 can repeat this process for additional evaluations of alternative control laws, such as described above using artificial intelligence or the like. Once the best control law is determined based on the overall thermal load of the racks, the processing circuit in step 138 can cause implementation of the best control law.

Figure 5B:
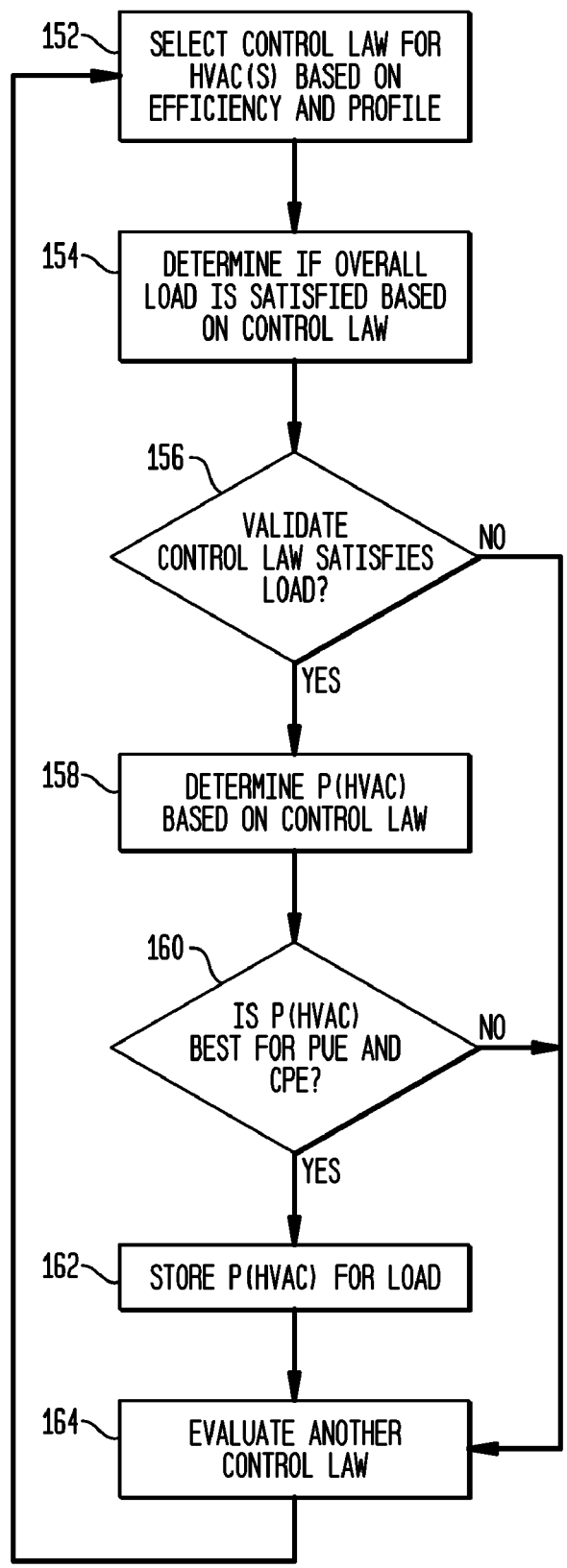

FIG. 5B shows another example of generating a control law that may be used as step 118 in FIG. 4. In this example, the set of operations may be used to optimize PUE or CPE based on thermal loads and profiles of the various racks, e.g., racks 12, 14, and/or data center 10. The result of the operations identifies the best control law for a given overall thermal load for the data center. The operations of FIG. 5B may also be used as part of step 136 of FIG. 5A.

As a consequence, the operations of FIGS. 5A-5D may be generated prior to actual data center operations, such as by the virtual data center 70 as described above, and stored for future use. Alternatively, the operations may be generated in quasi-real time, in response to actual environmental parameters of the data center.

In step 152, the processing circuit 60 selects a first control law to be implemented for a given overall thermal load of the data center 10 based on at least one of the efficiency characteristic information of the HVAC system and the rack profiles. In step 154, the processing circuit 60 determines if the overall thermal load of the data center is satisfied based on the first control law. Similar to step 116 of FIG. 4, if the thermal load is not satisfied, alternative control laws are selected until the thermal load is satisfied with the selected control law, such as in step 164.

Assuming the first control law satisfies the load, the processing circuit 60 in step 158 determines the total power consumption of the HVAC system(s), $P_{HVAC}$, based on the first control law. It calculates $P_{HVAC}$ by adding the individual predicted or actual power draw from each HVAC system and components thereof based on the first control law to be implemented.

In step 160, the processing circuit 60 determines whether the $P_{HVAC}$ based on the first control law is the best for optimizing PUE and CPE of the data center 10. In other words, the processing circuit determines whether the $P_{HVAC}$ is the lowest possible for the current thermal load of the racks, e.g., racks 12, 14. If the answer in step 160 is negative, then the processing circuit 60 proceeds to step 164 discussed below. If the answer, however, is positive, then the processing circuit 60 in step 162 stores the first control law as the best for optimizing PUE and CPE of the data center 10 for the overall given thermal load of the racks. The processing circuit 60 then proceeds to step 164.

In determining the PUE and CPE of step 160, the remote service center 28 may also obtain power consumption data from various devices in the building, such as the server computers of the racks, lighting, alarm and security, and the components of the HVAC system(s) 24 for use in calculating $P_{FAC}$ and/or $P_{IT}$. Here, the processing circuit 23 of BAS 22 obtains power calculations from sensors that are configured for power consumption measurement at their respect application. Such sensors would be attached to the electrical power inputs of any devices that use electrical power, including but not limited to the fan, the compressor, the condenser, the evaporator, and pumps. The processing circuit 60 of the remote service center 28 can calculate the amount of electrical power used to operate the HVAC system(s). More information regarding these calculations is found in U.S. Patent Application Publ. No. 2008/0066474A1, which is incorporated herein by reference in its entirety. In this case, the remote service client and its components can optimize $P_{FAC}$ used in calculating PUE and CPE of the data center.

In step 164, the processing circuit 60 determines whether there are any other alternative control laws to be evaluated. If so, the processing circuit 60 returns to step 152 to select another control law. If not, then the evaluation is complete, and the processing circuit 60 in step 162 stores the control law associated with the thermal load of the racks and PUE and CPE optimization as the control law to be implemented when the similar overall thermal loads are encountered in the future.

With additional reference to FIG. 1A, step 160 of FIG. 5B can further include the remote service center 28 using its components to develop a preferred control law of the HVAC system(s) 24 for a given rack profile, as described above. For example, the objective function 66 models $P_{HVAC}$ for a given control law and the optimization engine 68 optimizes $P_{HVAC}$ used in the calculation of PUE and CPE. Also, the remote service center 28 may suitably store the control laws in its memory 62. The stored data is time-stamped or at least associated with a time-date value. If the remote service center 28 has a control law already stored in memory 62, the processing circuit 60 of the remote service center 28 can then compare the created control law with a stored control law to determine which is better for optimizing PUE and CPE for a given rack profile.

Figure 5C:
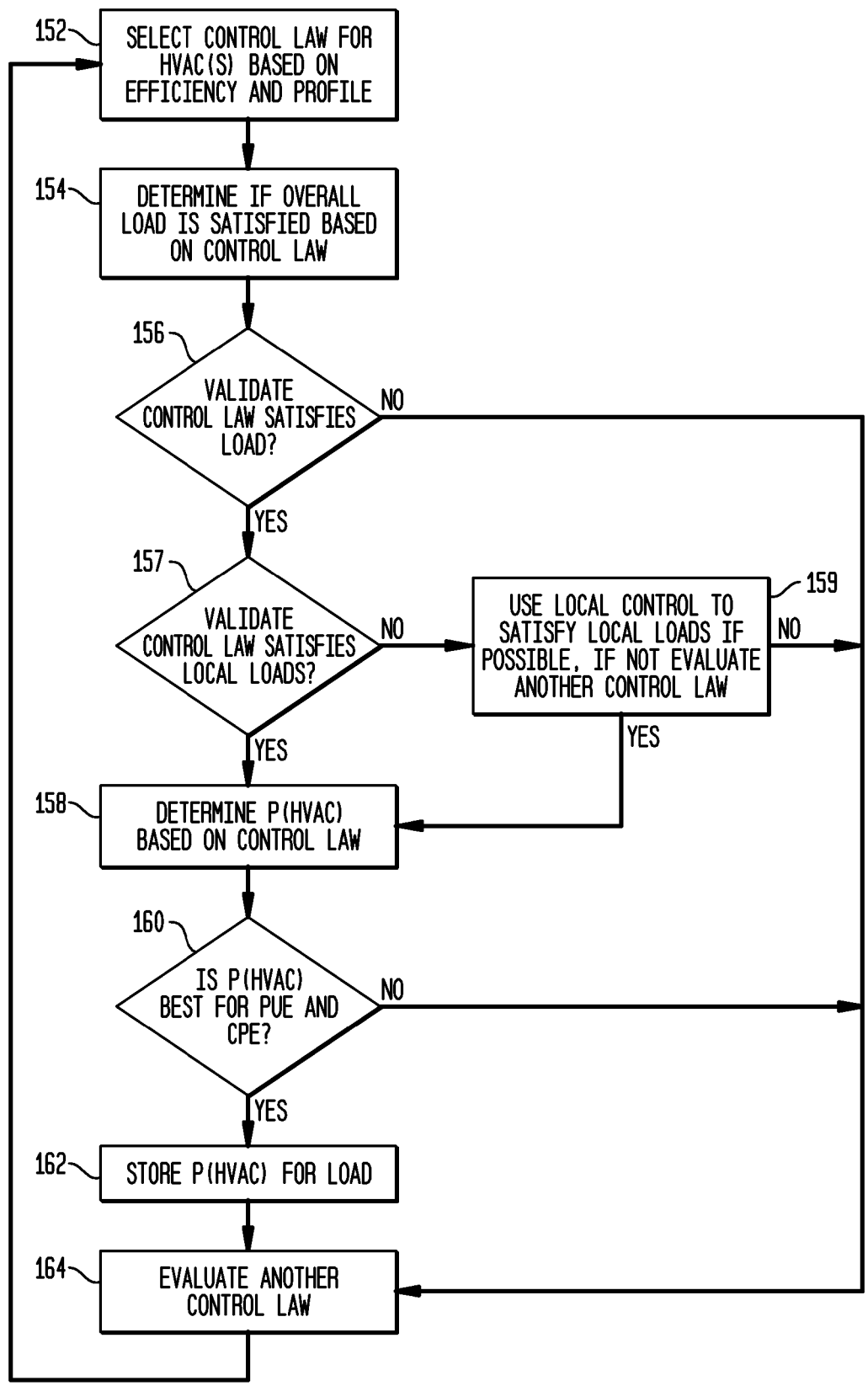

FIG. 5C shows another aspect of operationally controlling the data center 10. In accordance with another embodiment, FIG. 5C illustrates the flow diagram of FIG. 5B, with the exception as described herein. There are some scenarios where the generated control law is sufficient to satisfy the overall thermal demand of the data center, and yet some local racks and/or server computers are considered undesirably warm. Instead of first evaluating another control law as in step 164, the processing circuit 31 of the rack controller in step 159 can determine whether local control of one or more HVAC systems can be modified in order to satisfy the local thermal load of the rack and/or server computer. For example, the processing circuit 31 of rack controller 19a of FIG. 3B can generate a control law for HVAC system 24a, essentially overriding the commands of BAS 22, to modify one or more aspects thereof, such as air flow and discharge air temperature. Here, the increased cooling of the HVAC system 24a can satisfy the local load of the rack. If it is determined that the after such modifications to the HVAC system 24a, the local load is not satisfied, then the processing circuit 31 can permit the operations to go to step 164 to evaluate another control law for the HVAC system. Optionally, the control laws for each of the HVAC systems may originate with one or more rack controllers, instead of a supervisory controller such as BAS 22. To this end, the processing circuit 60 can still determine the $P_{HVAC}$ based on multiple control laws of the rack controllers, as in step 158, and the best control law for each of the rack controllers for optimizing PUE and CPE, as in step 160. In one aspect, the development of the best control law will take into consideration differences in power usage using local control and/or using system-wide control of the HVAC system(s) 24 in order to develop a control law that optimizes PUE and CPE. Also, the operational steps of FIG. 6, described below, using the virtual data center, can also validate the optimal control laws for each of the rack controllers and/or the HVAC system(s).

Figure 5D:
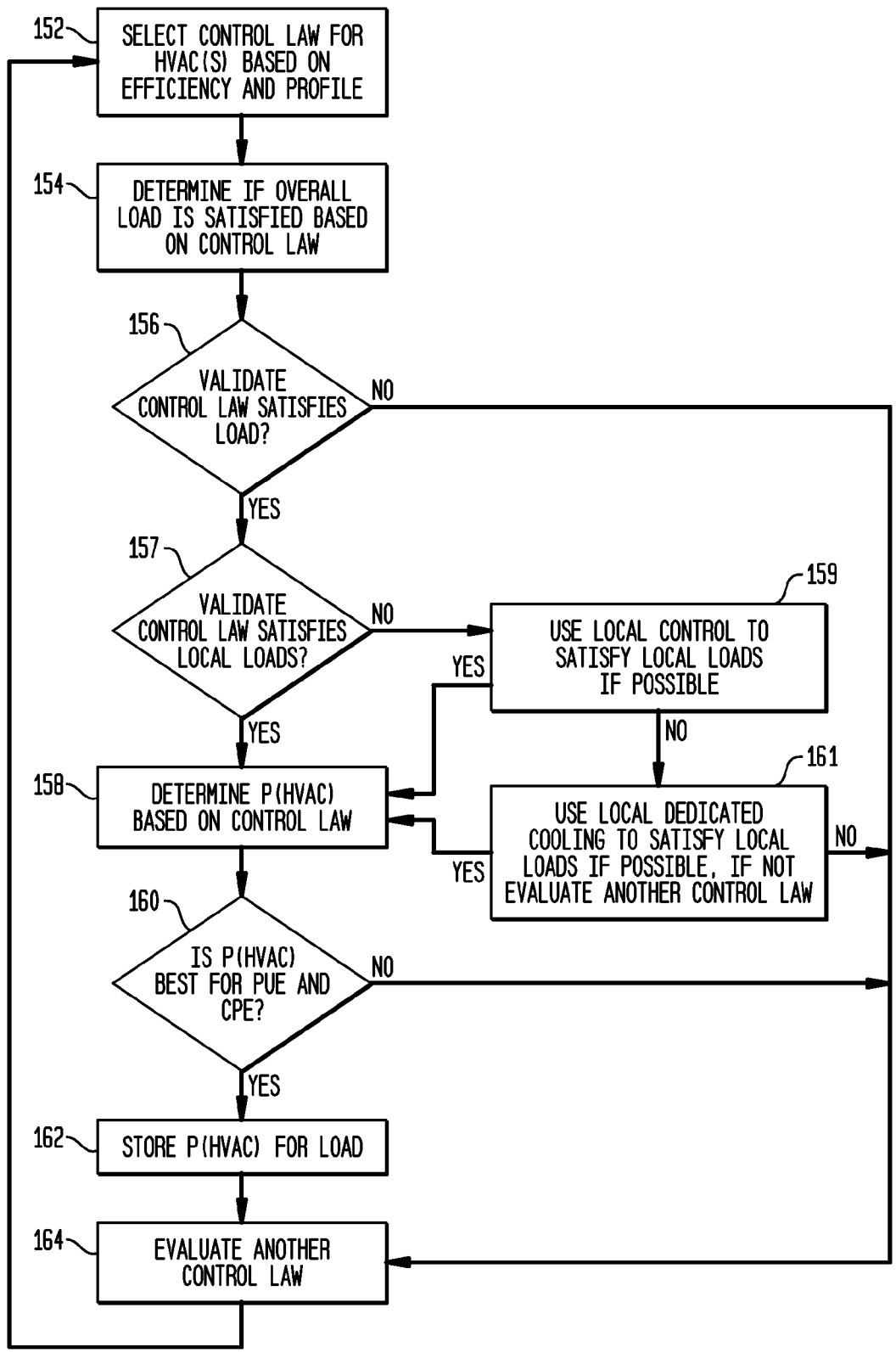

FIG. 5D shows another aspect of operationally controlling the data center. In accordance with another embodiment, FIG. 5D illustrates the flow diagram of FIG. 5C, with the exception as described herein. There are some scenarios where the generated control law is sufficient to satisfy the overall thermal demand of the data center, and yet some local racks and/or server computers are considered undesirably warm. Instead of first evaluating another control law as in step 164, the processing circuit 31 of the rack controller in step 161 can determine whether operation of one or more dedicated coolers can be engaged in order to satisfy the local load of the rack and/or server computer. For example, the processing circuit 31 of rack controller 19*a* of FIG. 3C can generate a control law for the dedicated cooler 27*a* to operate and provide the necessary cooling output for that particular rack and/or server computer. Here, the increased cooling of the dedicated cooler 27*a* can satisfy the local thermal load of the rack. If it is determined that the after such modifications to the HVAC system 24*a*, the local load is not satisfied, then the processing circuit 31 can permit the operations to go to step 164 to evaluate another control law for the HVAC system. Optionally, the control laws for each of the HVAC system(s) and the dedicated coolers may originate with one or more rack controllers. To this end, the processing circuit 60 can still determine the $P_{HVAC}$ based on multiple control laws of the rack controllers and/or HVAC system(s), as in step 158, and the best control laws for each of the rack controllers for optimizing PUE and CPE of the data center, as in step 160. In one aspect, the development of the best control law will take into consideration differences in power usage using dedicated coolers 27*a*-27*d* and the HVAC system(s) 24 in order to develop a control law that optimizes PUE and CPE. Also, the operational steps of FIG. 6, described below, using the virtual data center, can validate the optimal control laws for each of the rack controllers and/or the HVAC system(s).

Figure 6:
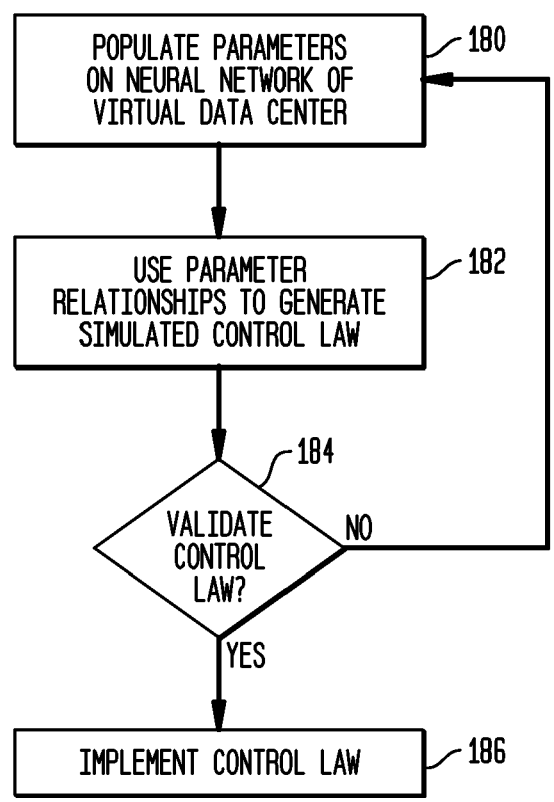
FIG. 6 illustrates a flow diagram of one embodiment of an exemplary set of operations using a virtual data center that may be used by a processing circuit for satisfying a thermal load of a data center using measured environmental parameters.

FIG. 6 shows another aspect for determining whether the selected control law is the best for optimizing PUE and CPE that may be used as step 160 in FIG. 5B. With additional reference to FIG. 1A, the processing circuit 60 of the remote service center 28 in step 180 can populate the actual environmental parameters received from the microsystems on the neural network of the virtual data center 70. In step 182, the processing circuit 60 can then generate a simulated control law based on the actual sensed environmental parameters.

In step 184, the processing circuit 60 and the virtual data center 70 puts the simulated control law through a training process in order to validate the simulated control law, as described above. To summarize, the validation step occurs through a series of analyzing mathematical relationships between the actual data of the various inputs and outputs of the environmental parameters and rack profiles and the HVAC system(s) to define crisp rules in the virtual data center. The accuracy of the neural network models of the virtual data center is proven through a neural network training process and a prediction process that selects the best neural network model for optimization of PUE and/or CPE of the data center. Random sets of data represented of the control law and environmental parameters of the racks and/or data center may also be used in the neural network model to validate the simulated control law. In one example, such optimization can be achieved through controlling at least one of the discharge air temperature, air flow, and the other set points listed above, as well as matching server computer/rack loads with uniform temperature distribution in both space and time. If no validation, the processing circuit 60 returns to step 180 where environmental parameters are used for an alternative simulated control law. According to step 186, the control law is finally validated and ready for implementation in the actual data center.

It should be understood that various changes and modifications to the presently preferred embodiments described herein will be apparent to those skilled in the art. Changes and modification may include, but are not limited to, part or component selection, selection of component values or characteristics, precise arrangement and/or layout, inclusion of a single or dual supply. Such changes and modifications can be made without departing from the spirit and scope of the present invention and without diminishing its intended advantages. It is therefore intended that such changes and modifications be covered by the appended claims.

What is claimed is:

1. An arrangement for optimizing power efficiency of a data center having a plurality of racks having at least one server computer, comprising:
a plurality of sensors coupled to one or more of the plurality of racks and operable to measure at least one environmental parameter of said rack, each of the sensors configured to wirelessly transmit a measured environmental parameter; and
a processing circuit configured to receive information based on the at least one measured environmental parameter, wherein the processing circuit further comprises a virtual data center representative of said data center, wherein the virtual data center is configured to:
acquire the at least one environmental parameter;
generate a simulated control law for operating said air conditioning system based on the at least one environmental parameter;
validate the simulated control law before implementation in said air conditioning system; and
wherein the processing circuit is further configured to:
generate a profile indicative of the at least one environmental parameter corresponding to said rack; and
generate a control law configured to operate one or more air conditioning systems in order to satisfy a thermal demand of the data center in an optimally power efficient manner based at least in part on information representative of the profile of said rack.

2. The arrangement of claim 1, wherein each of the sensors further comprises a micro-electro-mechanical systems (MEMS) sensor.

3. The arrangement of claim 1, wherein the at least one environmental parameter comprises at least one of temperature, relative humidity, pressure, and air flow.

4. The arrangement of claim 1, further comprising a memory operably connected to the processing circuit, the memory configured to store power efficiency characteristic information for said air conditioning unit.

5. The arrangement of claim 4, wherein the generated control law is based on at least one of the profile of said rack and the power efficiency characteristic information of said air conditioning unit.

6. The arrangement of claim 5, wherein the processing circuit is further configured to calculate total power consumption of said air conditioning system.

7. The arrangement of claim 1, wherein the virtual data center comprises an expert control system configured to optimize total power consumption of said air conditioning system for the generated profile of said rack.

8. The arrangement of claim 7, wherein the expert control system is selected from the group consisting of a fuzzy expert control system and a neural network.

9. The arrangement of claim 8, further comprising a memory operably connected to the processing circuit and configured to archive the optimized total power consumption of said air conditioning system for the generated profile of said rack.

10. A method for optimizing power efficiency of a data center having a plurality of racks having at least one server computer, comprising:
    receiving at least one measured environmental parameter of one or more racks;
    acquiring, by a virtual data center representative of the data center, the at least one measured environmental parameter;
    generating, by the virtual data center, a simulated control law for operating an air conditioning system based on the acquired measured environmental parameter; and
    validating the simulated control law before implementation in said air conditioning system;
    generating a profile indicative of the at least one measured environmental parameter of said rack;
    generating a control law operable to satisfy a thermal demand of the data center in an optimally power efficient manner based at least in part on information representative of the profile of said rack; and
    implementing the control law to operate one or more air conditioning systems.

11. The method of claim 10, wherein each of the sensors further comprises a micro-electro-mechanical systems (MEMS) sensor coupled to the racks and configured to wirelessly transmit a measured environmental parameter, the method further comprising wirelessly transmitting the at least one environmental parameter.

12. The method of claim 10, wherein the at least one measured environmental parameters comprises at least one of temperature, relative humidity, pressure, and air flow.

13. The method of claim 10, further comprising storing power efficiency characteristic information for said air conditioning system in a memory operably coupled to a processing circuit.

14. The method of claim 13, wherein the generated control law is based on at least one of the profile of said rack and the power efficiency characteristic information of said air conditioning system.

15. The method of claim 14, further comprising calculating total power consumption of said air conditioning system.

16. The method of claim 10, wherein the virtual data center comprises an expert control system, and
    wherein generating the simulated control law comprises generating, by the expert control system, the simulated control law.

17. The method of claim 16, wherein the expert control system is configured to optimize total power consumption of said air conditioning system for the generated profile of said rack.

18. The method of claim 16, wherein the expert control system is selected from the group consisting of a fuzzy expert control system and a neural network.

19. The method of claim 18, further comprising storing the optimized total power consumption of said air conditioning system for the generated profile of said rack in a memory operably coupled to a processing circuit.

20. An arrangement for optimizing power efficiency of a data center having a plurality of racks having at least one server computer, comprising:
    a plurality of sensors coupled to one or more racks and operable to measure at least one environmental parameter of said rack, each sensor configured to wirelessly transmit a measured environmental parameter; and
    a rack controller coupled to said rack and associated with one or more sensors, the rack controller comprising a processing circuit configured to receive information based on the at least one measured environmental parameter from the respective sensors,
    wherein the processing circuit comprises a virtual data center representative of said data center and configured to generate a simulated control law for operating said air conditioning system based on the at least one environmental parameter and validate the simulated control law before implementation in said air conditioning system; and
    wherein the processing circuit is further configured to generate a control law configured to operate one or more air conditioning systems in order to satisfy a local thermal demand of said rack in an optimally power efficient manner based at least in part on information representative of the at least one environmental parameter.

21. An arrangement for optimizing power efficiency of a data center having a plurality of racks having at least one server computer, comprising:
    a plurality of sensors coupled to one or more racks and operable to measure at least one environmental parameter of said rack, each sensor configured to wirelessly transmit a measured environmental parameter; and
    a processing circuit configured to receive information based on the at least one measured environmental parameter, wherein the processing circuit comprises a virtual data center representative of said data center and configured to generate a simulated control law for operating said air conditioning system based on the at least one environmental parameter and validate the simulated control law before implementation in said air conditioning system;
    wherein the processing circuit is further configured to: (1) generate a control law configured to operate a dedicated cooler configured to at least partially satisfy a local thermal demand of said rack, and (2) generate a control law configured to operate one or more air conditioning systems in order to satisfy an overall thermal load of the data center, the operation of the dedicated cooler and the one or more air conditioning systems being in an optimally power efficient manner based at least in part on information representative of the at least one environmental parameter.

* * * * *